(12) United States Patent
May et al.

(10) Patent No.: US 11,069,620 B2
(45) Date of Patent: Jul. 20, 2021

(54) DIE INTERCONNECT SUBSTRATE, AN ELECTRICAL DEVICE AND A METHOD FOR FORMING A DIE INTERCONNECT SUBSTRATE

(71) Applicant: Intel Corporation, Santa Clara, CA (US)

(72) Inventors: Robert Alan May, Chandler, AZ (US); Kristof Darmawikarta, Chandler, AZ (US); Sri Ranga Sai Sai Boyapati, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 109 days.

(21) Appl. No.: 16/474,585

(22) PCT Filed: Mar. 31, 2017

(86) PCT No.: PCT/US2017/025232
§ 371 (c)(1),
(2) Date: Jun. 28, 2019

(87) PCT Pub. No.: WO2018/182659
PCT Pub. Date: Oct. 4, 2018

(65) Prior Publication Data
US 2021/0134723 A1    May 6, 2021

(51) Int. Cl.
*H01L 23/532* (2006.01)
*H01L 23/522* (2006.01)
(Continued)

(52) U.S. Cl.
CPC ........ *H01L 23/5329* (2013.01); *H01L 23/293* (2013.01); *H01L 23/5226* (2013.01); *H01L 23/5385* (2013.01); *H01L 24/19* (2013.01)

(58) Field of Classification Search
CPC .............. H01L 23/5329; H01L 23/293; H01L 23/5226
See application file for complete search history.

(56) References Cited

U.S. PATENT DOCUMENTS

| | | | |
|---|---|---|---|
| 2014/0159228 A1* | 6/2014 | Teh | H01L 23/3114 257/734 |
| 2014/0264791 A1 | 9/2014 | Manusharow | |

(Continued)

FOREIGN PATENT DOCUMENTS

KR    1020060047178 A    5/2006

*Primary Examiner* — Patricia D Reddington
(74) *Attorney, Agent, or Firm* — 2SPL Patent Attorneys PartG mbB; Yong Beom Hwang

(57) ABSTRACT

A die interconnect substrate comprises a bridge die comprising at least one bridge interconnect connecting a first bridge die pad of the bridge die to a second bridge die pad of the bridge die. The die interconnect substrate comprises a multilayer substrate structure comprising a substrate interconnect. The bridge die is embedded in the multilayer substrate structure. The substrate interconnect extends from a level above the bridge die to a level below the bridge die. The multilayer substrate structure further comprises an electrically insulating layer comprising a first electrically insulating material. The multilayer substrate structure further comprises an electrically insulating filler structure located laterally between the bridge die and the electrically insulating layer, wherein the electrically insulating filler structure comprises a second electrically insulating material different from the first electrically insulating material.

25 Claims, 13 Drawing Sheets

(51) Int. Cl.
*H01L 23/29* (2006.01)
*H01L 23/538* (2006.01)
*H01L 23/00* (2006.01)

(56) References Cited

U.S. PATENT DOCUMENTS

2015/0028486 A1  1/2015  Liu et al.
2015/0048515 A1  2/2015  Zhang et al.
2016/0079196 A1  3/2016  Teh et al.

\* cited by examiner

DIE INTERCONNECT SUBSTRATE, AN ELECTRICAL DEVICE AND A METHOD FOR FORMING A DIE INTERCONNECT SUBSTRATE

TECHNICAL FIELD

Examples relate to concepts for die interconnects, and in particular to a die interconnect substrate, an electrical device and a method for forming a die interconnect substrate.

BACKGROUND

Semiconductor devices can include semiconductor dies, which are attached or connected to substrates via solder structures. Large bump pitch between solder structures can lead to larger devices being produced and also higher costs. Processes of higher accuracy and/or better alignment may be needed to produce solder structures with smaller bump pitch.

BRIEF DESCRIPTION OF THE FIGURES

Some examples of apparatuses and/or methods will be described in the following by way of example only, and with reference to the accompanying figures, in which.

DETAILED DESCRIPTION

Figure 1:
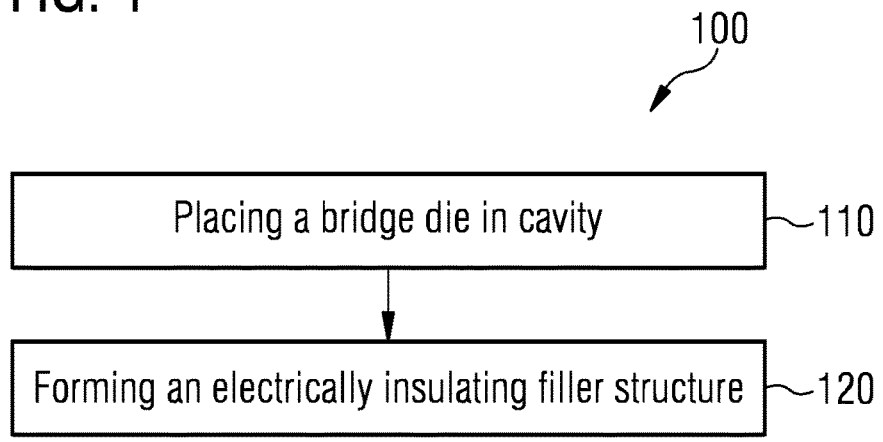
FIG. 1 shows a flow chart of a method for forming a die interconnect substrate.

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Electrical components or devices may be embedded in packages to provide protection against impact and corrosion, to hold the contact pins or leads and/or to dissipate heat produced by the device, for example. A semiconductor package may include one or more semiconductor components. Individual components may be formed in a silicon wafer before being cut and assembled in a package. A semiconductor package may have only few leads or contacts for devices such as diodes, or may have hundreds of contact interfaces (e.g. pads, solder balls or solder bumps) in case of a microprocessor, for example. In addition to providing connections to the semiconductor die and handling waste heat, the semiconductor package may protect the semiconductor die against the ingress of moisture, for example. Similarly, non-semiconductor electrical components (e.g. resistors, capacitors, inductors) may be arranged in packages.

FIG. 1 shows a method 100 for forming a die interconnect substrate.

The method 100 comprises placing (in 110) a bridge die in a cavity of a multilayer substrate structure. The bridge die comprises at least one bridge interconnect connecting a first bridge die pad of the bridge die to a second bridge die pad of the bridge die.

The multilayer substrate structure comprises an electrically insulating layer forming a lateral surface of the multilayer substrate structure next to the cavity. The electrically insulating layer comprises a first electrically insulating material.

The multilayer substrate structure further comprises a substrate interconnect. A portion of the substrate interconnect is located at a level below the bridge die.

The method 100 further comprises forming (in 120) an electrically insulating filler structure filling a gap located laterally between the bridge die and the multilayer substrate structure. The electrically insulating filler structure comprises a second electrically insulating material different from the first electrically insulating material.

Due to the forming of the electrically insulating filler structure, a level (or smooth) surface may be formed at the lateral surface of the multilayer substrate structure. Thus, forming further wiring layers or via portions above the level of the bridge die (e.g. by lithographic processes) may be carried out more accurately. Through the use of lithographic processes, wiring layers or via portions with smaller width and/or thicknesses may be formed which may lead to a reduction in a distance between solder structures (e.g.

smaller bump pitch) at an interface between the multilayer substrate structure and a semiconductor die. A reduced bump pitch may lead to smaller semiconductor devices, with improved current carrying capabilities being produced, and at lower costs.

The multilayer substrate structure may include a plurality of electrically insulating (build-up) layers forming at least part of an electrically insulating substrate. The electrically insulating substrate may be a polymer-based, epoxy-based and/or laminate based substrate. For example, the electrically insulating substrate may optionally include an electrically insulating core and/or the electrically insulating (dielectric) build-up layers. Each electrically insulating layer may include (or may be) the first electrically insulating material. The first electrically insulating material may be a build-up film material.

The multilayer substrate structure may further include at least part of a substrate interconnect to be formed. The substrate interconnect may be one of a plurality of substrate interconnects of the multilayer substrate structure. The substrate interconnect (or each substrate interconnect of the plurality of substrate interconnects) may include a plurality of lateral wiring layers and a plurality of vertical wiring layers arranged alternatingly with respect to each other in a substantially vertical direction. A width of a vertical wiring layer of the substrate interconnect may be larger than (e.g. more than 1.5 times, or e.g. more than 2 times, or e.g. more than 3 times a height of the vertical wiring layer). A maximal lateral dimension (e.g. a width) of the vertical wiring layer may be larger than 30 μm (or e.g. larger than 40 μm, or e.g. larger than 45 μm).

The multilayer substrate structure may be formed by repeatedly alternating between forming a build-up layer and forming lateral wiring layers and vertical wiring layers. For example, an electrically insulating build-up layer of the electrically insulating substrate may be formed on a substrate core (or on a previous formed lateral wiring layer). The build-up layer may be deposited by vacuum lamination. For example, the build-up laminate layer may be placed on a surface of the multilayer substrate structure and pressure and heat may be applied to the build-up laminate layer so that the build-up laminate layer adheres to surface of the multilayer structure. In this way, the build-up laminate layer becomes part of (or becomes connected to) the multilayer substrate structure.

The method may include forming an opening (or hole) extending substantially vertically through an electrically insulating build-up layer by a laser process (e.g. by laser drilling), and depositing electrically conductive material in the opening to form a vertical wiring layer of a substrate interconnect. The vertical wiring layer may contact or may connect to a previous lateral wiring layer of the substrate interconnect, for example. Vertical wiring layers of the plurality of substrate interconnects located at the same lateral level may be formed by depositing electrically conductive material in the openings simultaneously in the same process.

A lateral wiring layer extending in a substantially lateral (horizontal) direction, may be formed by forming (e.g. depositing) an electrically conductive layer (e.g. a metal layer, or e.g. a copper layer) on a surface of the electrically insulating substrate. The lateral wiring layer may be formed in selected areas of the multilayer substrate structure according to the desired or required wiring layout. For example, after forming the opening in the electrically insulating build-up layer, a semi-additive process (e.g. lithography, plating, seeding and/or etching) may be carried out. The semi-additive process may include forming a mask layer after forming the opening in the electrically insulating build-up layer. The semi-additive process may further include forming openings in the mask layer. After forming the openings in the mask layer, electrically conductive material may be deposited in the openings in the mask layer and in the opening in the electrically insulating build-up layer, to form the vertical wiring layer and the lateral wiring layer. Lateral wiring layers located at the same lateral level may be formed simultaneously in the same process. A lateral wiring layer of a substrate interconnect may be connected to a vertical wiring layer of the substrate interconnect at a previous (lower) wiring level.

By repeating the processes of forming a build-up layer, forming a vertical wiring layer and forming a lateral wiring layer, a substrate interconnect which extends vertically through at least part of a multilayer electrically insulating substrate structure may be formed. At least part of the substrate interconnect may be formed by these repetitive process even before forming the cavity. For example, even before forming the cavity, lateral wiring levels (e.g. at layer level n-1 and layer level n-2) may be present in the multilayer substrate structure. Before forming the cavity (and/or before forming the electrically insulating filler structure) it may be that the substrate interconnect does not extend to a level above the bridge die or above a level of the front surface of the bridge die. For example, the substrate interconnect may extend from a level between the front surface and the bottom surface of the bridge die to a level below the bridge die.

The method 100 may include forming the (first) electrically insulating layer (e.g. a laminate protection film) on a surface of the multilayer substrate structure before forming the cavity. Thus, before forming the cavity, the first electrically insulating layer may cover portions of the substrate interconnect of the multilayer substrate structure.

The method 100 may include forming the cavity at the (front) lateral surface of the multilayer substrate structure. The cavity may be formed in the first electrically insulating layer by drilling, for example. The cavity may extend from the lateral surface of the multilayer substrate structure to a depth of between 100 μm and 500 μm (or e.g. between 125 μm and 400 μm, or e.g. between 150 μm and 300 μm). Optionally, a depth of the cavity may be substantially equal to a thickness of the bridge die to be placed in the cavity. The method 100 may further include cleaning the cavity after forming the cavity.

The method 100 may include placing 110 the bridge die in the cavity after forming the cavity. After placing the bridge die in the cavity, a front surface of the bridge die and the first electrically insulating layer remaining next to the cavity may form a lateral surface of the multilayer substrate structure. The bridge die may be placed in the cavity so that there is a gap located laterally between a sidewall of the bridge die and a sidewall of the cavity. An average lateral dimension of the gap may lie between 5 μm and 15 μm (or e.g. between 5 μm and 10 μm). It may be understood that the examples described herein may also relate to gaps which may exist between other sidewalls of the bridge die and the multilayer substrate structure after placing the bridge die in the cavity.

After placing the bridge die in the cavity, the back surface of the bridge die may be in contact with an electrically conductive layer (e.g. at layer level n-2) which may be located at the bottom of the cavity of the electrically insulating substrate. The bridge die may not actually form an electrical connection to the electrically conductive layer (at layer level n-2), because the bridge die may not have a backside metallization contact layer. Thus, the bridge die may be physically in contact with a metal plane that lies on the n-2 layer, but this plane is not part of the wiring on that layer, but merely a base for the bridge die to sit on. The first bridge die pad and the second bridge die pad may be located at the front surface of the bridge die.

The method 100 may include forming 120 the electrically insulating filler structure after placing 110 the bridge die in the cavity. Forming 120 the electrically insulating filler structure may include forming an electrically insulating filler layer at the lateral surface of the multilayer substrate structure. Forming the electrically insulating filler layer may include placing an electrically insulating laminate layer on the lateral surface of the multilayer structure and applying pressure to the electrically insulating laminate layer so that a portion of the electrically insulating laminate layer is pressed into the gap. For example, the electrically insulating laminate layer may fill the cavity (e.g. the gaps in the cavity laterally surrounding the bridge die).

Forming 120 the electrically insulating filler structure may further include removing at least part of the electrically insulating filler layer until the first electrically insulating layer and the bridge die are exposed. The electrically insulating filler layer may include (or may be) a second electrically insulating material which is different to the first electrically insulating material. Removing at least part of the electrically insulating filler layer may include etching the electrically insulating filler layer with an etchant (e.g. by a chemical process, or e.g. by a mechanical process such as polishing). The etchant may be oxygen and/or a fluorine-based plasma etchant, for example. The etchant, the second electrically insulating material, and the first electrically insulating layer, may be selected so that the first electrically insulating layer and the bridge die may serve as an etch stop during the etching of the electrically insulating filler layer.

During the etching process, an etch rate of the electrically insulating filler layer may be at least 100 times (or e.g. at least 500 times, or e.g. at least 1000 times) an etch rate of the first electrically insulating layer, for example. Additionally or optionally, an etch rate of the electrically insulating filler layer may be at least 100 times (or e.g. at least 500 times, or e.g. at least 1000 times) an etch rate of the bridge die, for example. The electrically insulating filler layer may be a polyimide-based or epoxy-based filler structure. For example, the second electrically insulating material may be a polyimide and/or an epoxy. The electrically insulating filler layer may include filler particles (e.g. silica filler particles). The filler particles of the electrically insulating filler layer may be embedded in the polyimide or epoxy of the electrically insulating filler layer, for example. A concentration of filler particles of (or in) the electrically insulating filler layer (and thus the electrically insulating filler structure) may lie between 10% and 50% (or e.g. between 20% and 40%) of the weight of the electrically insulating filler layer. For example, the concentration filler particles in the electrically insulating filler layer may lie between 10 wt % and 50 wt % (or e.g. between 20 wt % and 40 wt %). Additionally or optionally, the build-up layers of the multilayer substrate structure may include filler particles (e.g. silica filler particles). The filler particles of the build-up layer may be embedded in the laminate material of the build-up layer. A concentration of filler particles of (or in) the build-up layers of the multilayer substrate structure may lie between 50% and 80% (or e.g. between 60% and 70%) of the weight of the build-up layers.

The method 100 may further include forming a first via portion on the first bridge die pad and a second via portion on the second bridge die pad after forming the electrically insulating filler structure. The first via portion and the second via portion may be referred to as lithographic vias (LiV), which may be formed on (e.g. directly on) the bridge die pads using high resolution (HR) lithography.

Forming the first via portion and the second via portion may include forming a mask layer (e.g. a photoresist layer) on at least the bridge die. For example, the mask layer may cover the lateral surface of the multilayer substrate structure. Forming the first via portion and the second via portion may further include removing portions of the mask layer to form openings exposing at least part of the first bridge die pad and at least part of the second bridge die pad by a lithographic process. Forming the first via portion and the second via portion may further include forming (e.g. depositing) electrically conductive material (e.g. copper) in the openings of the mask layer to form the first via portion and the second via portion. The electrically conductive material may be formed by electroplating, for example. Each via portion may be part of a bridge contact structure to be formed on a bridge die pad of the bridge die. The bridge contact structure may connect a bridge die pad to a contact interface structure (e.g. a solder structure or e.g. a solder bump) to be formed.

The method 100 may further include forming a second electrically insulating layer of the multilayer substrate structure on the lateral surface of the multilayer substrate structure after forming the first via portion and the second via portion. The second electrically insulating layer may be the same material as the first electrically insulating layer. For example, the second electrically insulating layer may be a build-up layer and may be deposited by vacuum-lamination. The second electrically insulating layer may cover the lateral surface of the multilayer substrate structure. For example, the second electrically insulating layer may cover the first via portion and the second via portion.

The method 100 may further include planarizing (e.g. by chemical mechanical polishing CMP) a surface (to expose (or e.g. reveal) the first via portion and the second via portion after forming the second electrically insulating layer. The surface may be a front lateral surface of the second electrically insulating layer (and/or the multilayer substrate structure), for example.

The method 100 may further include forming a first vertical wiring layer (e.g. between layer level n-1 and layer level n) of the substrate interconnect after forming the first via portion and the second via portion (e.g. after planarizing the surface to expose the first via portion and the second via portion). Forming the first vertical wiring layer may include forming an opening to expose at least part of the substrate interconnect by a laser process. For example, the opening may be formed by using laser drilling (e.g. by using a $CO_2$ laser) to from an opening in the first electrically insulating layer and the second electrically insulating layer. The laser process for forming the first vertical wiring layer may be the last laser process for forming openings for the formation of vertical wiring layers of the substrate interconnect, for example. Additionally or optionally, a desmear process may be carried out after forming the opening to clean the opening, for example. The desmear process may remove any epoxy residue left at the bottom of the via and clean the residue so that the via and the pad may be fully electrically connected.

The method 100 may further include simultaneously forming a first lateral wiring layer (at layer level n) of the substrate interconnect and a first lateral wiring layer (at layer level n) of the bridge contact structure. Optionally, the first vertical wiring layer, first lateral wiring layer of the substrate interconnect and the first lateral wiring layer of the bridge contact structure may be formed using a semi-additive process SAP with HR lithography. For example, the method 100 may include forming a mask layer covering the lateral surface of the multilayer substrate structure after forming the opening by the laser process. The method 100 may include forming openings in the mask layer to expose the opening in the first electrically insulating layer, and at least the first via portion and the second via portion. The method 100 may further include forming (or e.g. depositing) electrically conductive material in the openings of the mask layer. Thus, electrically conductive material (e.g. copper) may be formed (e.g. deposited) in the opening of the first electrically insulating layer to form the first vertical wiring layer. Additionally, the first lateral wiring layer of the substrate interconnect and the first lateral wiring layer of the bridge contact structure may be formed. The electrically conductive material may be deposited by electroplating, for example.

Alternatively, forming the first vertical wiring layer of the substrate interconnect is not carried out after forming the first via portion and the second via portion. Instead, after the cavity fill etch back process, the method may include forming an opening to expose at least part of the substrate interconnect by a laser process. For example, the opening may be formed by using laser drilling to from an opening in the first electrically insulating layer before depositing a subsequent second electrically insulating layer. The opening in the first electrically insulating layer may thus be formed before forming the first via portion and the second via portion. After forming the opening in the first electrically insulating layer, the method 100 may include simultaneously forming the first vertical wiring layer, a first lateral wiring layer of the substrate interconnect, the first via portion and the second via portion in the same lithographic process. For example, the first vertical wiring layer, a first lateral wiring layer of the substrate interconnect, the first via portion and the second via portion may be formed using a semi-additive process SAP with HR lithography. Additionally, instead of forming the second electrically insulating layer of the multilayer substrate structure before forming the first vertical wiring layer, the method 100 may include forming the second electrically insulating layer of the multilayer substrate structure on the lateral surface of the multilayer substrate structure after forming the first vertical wiring layer. The method 100 may further include planarizing a lateral surface of the multilayer substrate structure to expose the first via portion and the second via portion and the first lateral wiring layer of the multilayer substrate structure after forming the second electrically insulating layer.

The method 100 may further include simultaneously forming a first contact interface structure and a second contact interface structure (first level interconnect FLI structures) after forming the first via portion, the second via portion and the first vertical wiring layer. The first contact interface structure and the second contact interface structure may each be part of a solder bump structure for providing an ohmic or electrical contact to a semiconductor die or semiconductor device. For example, the first contact interface structure and the second contact interface structure may each be configured for attaching a semiconductor die to the multilayer substrate structure via a controlled collapse chip connection C4 (e.g. a flip chip connection). Each contact interface structure may be connected to a bridge die pad via a bridge contact structure. For example, the first contact interface structure may be connected to the first bridge die pad via a first bridge contact structure. The second contact interface structure may be connected to the substrate interconnect, for example.

Forming the first contact interface structure and the second contact interface structure may include forming (e.g. laminating) a solder resist mask layer at a lateral surface of the multilayer substrate structure and removing portions of the solder resist mask layer to form openings exposing the substrate interconnect and the bridge contact structure by a HR lithographic process. Forming the first contact interface structure and the second contact interface structure may further include forming (e.g. depositing) electrically conductive material in the openings of the mask layer to form the first contact interface structure and the second contact interface structure. Both the first contact interface structure and the second contact interface structure may protrude from (or may be exposed at) the front surface of the multilayer substrate structure. The method 100 may further include depositing a surface finish layer (e.g. NiPdAu) at the lateral surface of the first contact interface structure and at the lateral surface of the second contact interface structure.

The method 100 may further include attaching (by soldering) a semiconductor die to the first bridge die pad of the bridge die. Additionally, the method may further include attaching a second semiconductor die to the second bridge die pad of the bridge die. The multilayer substrate structure may be attached (or e.g. soldered to) the first semiconductor die via the first contact interface structure and the second contact interface structure. Thus, the first semiconductor die may be attached (or connected) to the first bridge die via the first contact interface structure. Optionally, the first contact interface structure and the second contact interface structure may be attached to the same semiconductor die. Additionally, the second semiconductor die may be attached to the second bridge die pad via an interface structure connected to the second bridge die pad.

Embedded multi-die interconnect bridge (EMIB) technology may use UV laser drilling to form the connection between the EMIB die and the surrounding substrate. However, the accuracy of this laser may limit how far the bump pitch may be scaled from 55 µm. Improvements in the laser may drive the pitch down to 45 µm but anything less may use a fundamentally different technology. The examples described herein may utilize the lithographic via (LiV) process to improve alignment and enable bump pitch scaling down to 30 µm. Laser drilling may use many laser tools to meet high volume manufacturing due to the slower throughput time. Laser drilling may drill vias one at a time while lithography would form multiple vias at once. Thus, forming LiV by patterning vias and routing on layer n, may decrease the cost of the process.

In the examples described herein, instead of forming a via using laser drilling, lithographic vias (LiV) may be formed using a lithography process in which a via may be patterned and plated on top of existing Cu features. The lithographic processes may lead to tighter alignment and may lead to smaller feature sizes when compared to laser based processes that rely on a galvanometer. Galvanometers introduce more variation because they are moved for each shot whereas lithographic vias are formed all at once ensuring equal spacing.

In the examples, an aspect ratio of the via portion may be 1:1 (which may not possible be possible with a laser via). Additionally, a different material may surround the bridge die due to the cavity fill and etchback process. The various examples may allow for bump pitch scaling below 45 um. Additionally, the processes may be compatible with substrate manufacturing lines.

FIGS. 2A to 2L show schematic illustrations of a method 200 for forming a die interconnect substrate. For example, FIGS. 2A to 2L show a sample process flow utilizing the LiV process to pattern small vias with tight alignment on the EMIB die. Pre-filling the cavity may help eliminate concerns of dry film resist (DFR) tenting over the cavity gap, for example.

Figure 2A:
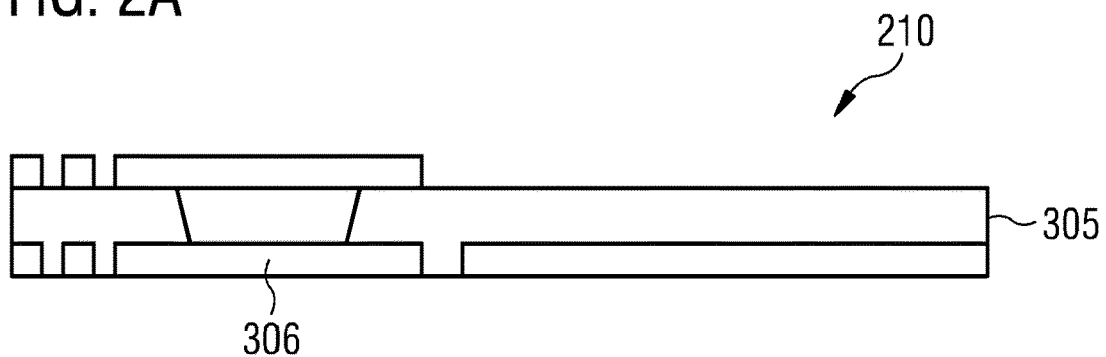
FIGS. 2A to 2L show schematic illustrations of a method for forming a die interconnect substrate.

The process may have an incoming substrate onto which is laminated a dielectric build-up protection film layer. The film may protect the traces from cavity drilling and desmear for example. As shown in FIG. 2A, the method may include forming (in 210) at least part of a multilayer substrate structure 305. The multilayer substrate structure 305 may be formed by repeatedly alternating between forming a build-up layer and forming wiring layers (e.g. using semi-additive processes). Thus, a multilayer substrate structure 305 including a plurality of electrically insulating (build-up) layers forming at least part of an electrically insulating substrate may be formed. The multilayer substrate structure 305 may include at least part of a substrate interconnect 306 to be formed.

Figure 2B:
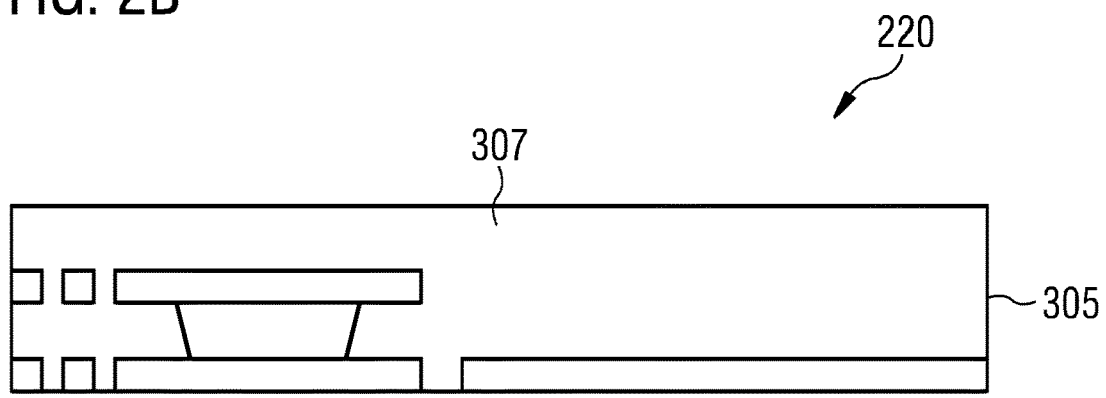

As shown in FIG. 2B, the method may include forming (in 220) an electrically insulating layer 307 (e.g. by laminating a protection film) on a surface of the multilayer substrate structure 305. The electrically insulating layer 307 may form a lateral surface of the multilayer structure.

Figure 2C:
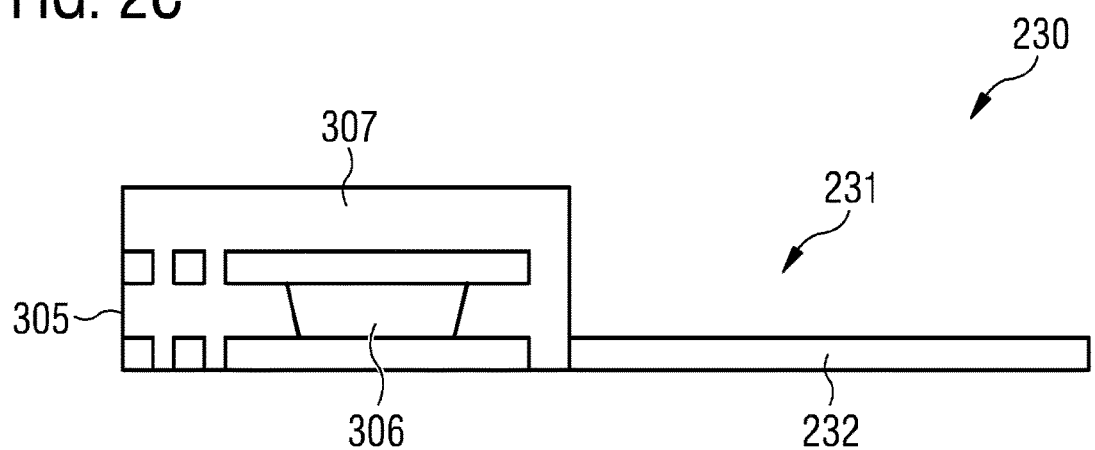

Next, a cavity may be formed and the bridge die placed inside. As shown in FIG. 2C, the method may include forming (in 230) a cavity 231 at the (front) lateral surface of the multilayer substrate structure 305. The cavity 231 may be formed at least in the first electrically insulating layer by drilling, for example. Forming the cavity may expose an electrically conductive lateral wiring layer 232 which may be located at the bottom of the cavity (e.g. at level n-2). The method may further include cleaning the cavity.

Figure 2D:
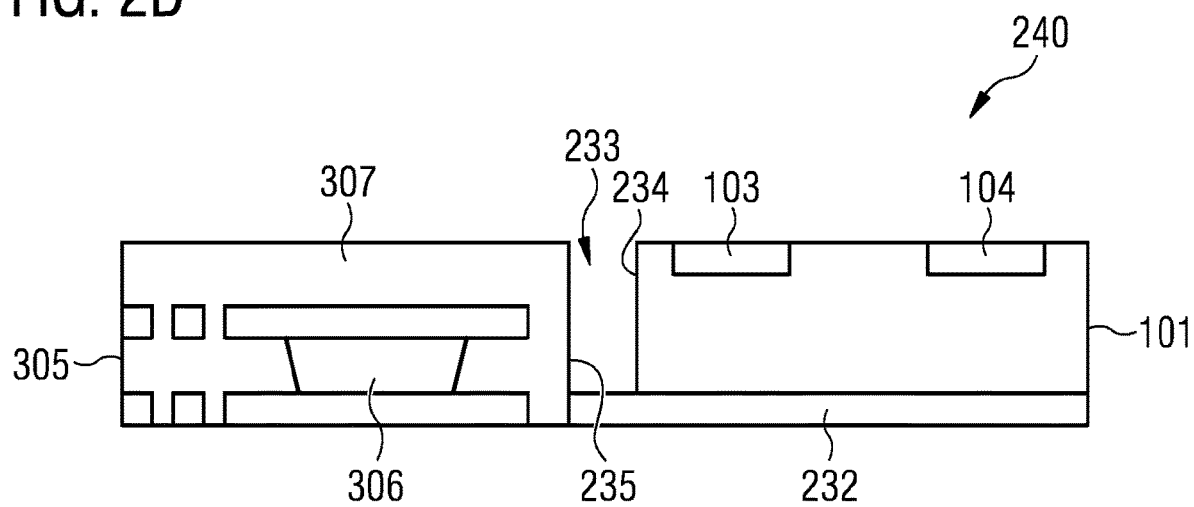

As shown in FIG. 2D, the method may include placing (in 240) the bridge die 101 in the cavity 231 of the multilayer substrate structure 305 after forming the cavity. The bridge die 101 may include at least one bridge interconnect connecting a first bridge die pad 103 of the bridge die to a second bridge die pad 104 of the bridge die. After placing the bridge die 101 in the cavity 231, a front surface of the bridge die and the first electrically insulating layer remaining next to the cavity may form a lateral surface of the multilayer substrate structure 305. The bridge die 101 may be placed in the cavity 231 so that there is a gap 233 located laterally between a sidewall 234 of the bridge die 101 and a sidewall 235 of the cavity. An average lateral dimension of the gap 233 may lie between 5 µm and 15 µm (or e.g. between 5 µm and 10 µm).

Figure 2E:
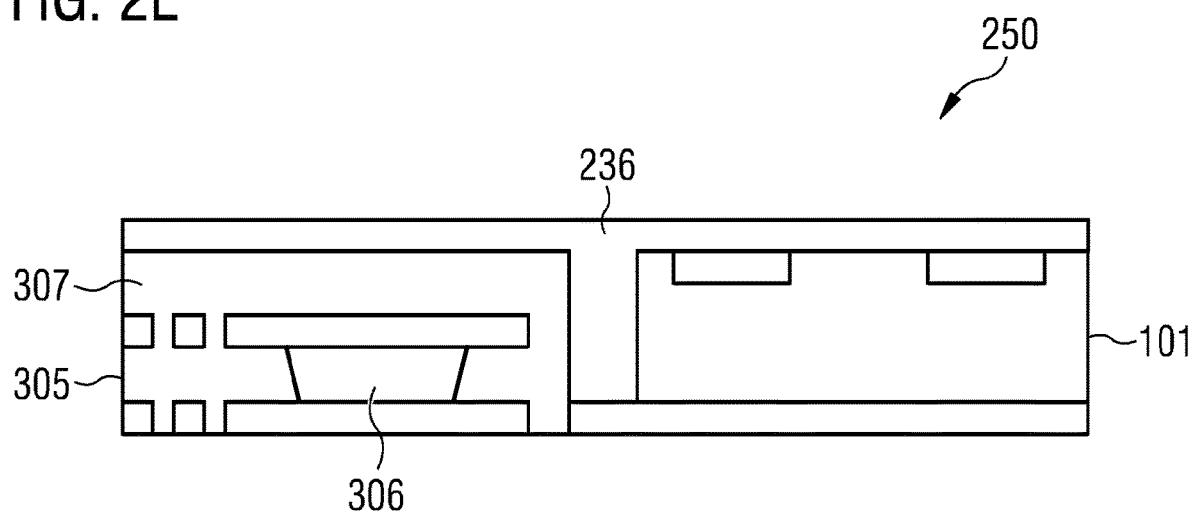
Figure 2F:
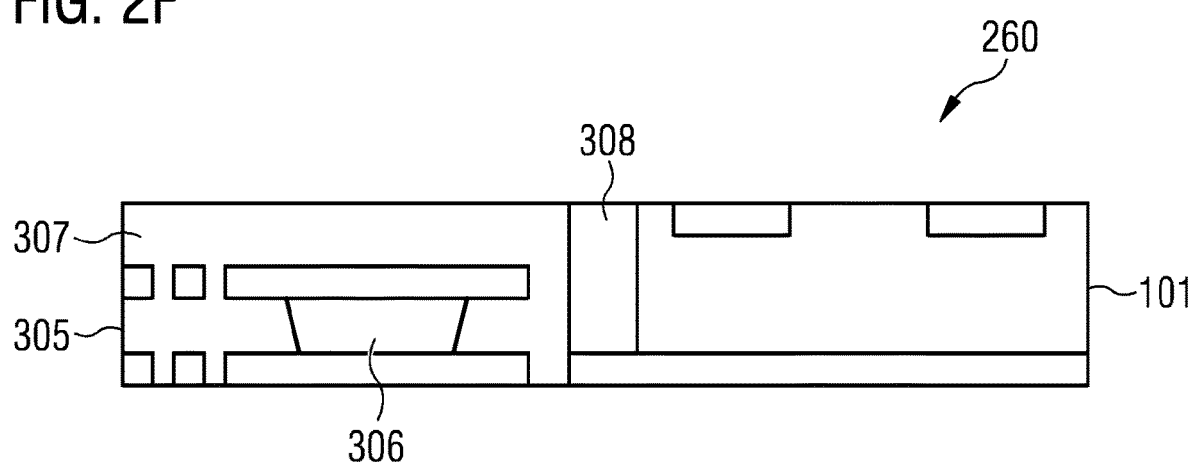

The cavity may then be laminated with a filler material that can be differentially etched compared to the buildup dielectric and bridge die (which will serve as etch stops). A selection of the filler material and an etch back method may be chosen to avoid the risk of over etching the filler material between the bridge die and protection film. As shown in FIGS. 2E and 2F, the method may include forming the electrically insulating filler structure after placing the bridge die 101 in the cavity 231. Forming the electrically insulating filler structure may include forming (in 250) an electrically insulating filler layer 236 at the lateral surface of the multilayer substrate structure 305. Forming the electrically insulating filler layer may include placing an electrically insulating laminate layer 236 on the lateral surface of the multilayer structure 305 and applying pressure to the electrically insulating laminate layer 236 so that a portion of the electrically insulating laminate layer 236 is pressed into the gap 233. For example, the electrically insulating laminate layer may fill the cavity (e.g. the gaps in the cavity laterally around the bridge die).

Forming the electrically insulating filler structure may further include removing (in 260) at least part of the electrically insulating filler layer 236 until the first electrically insulating layer 307 and the bridge die 101 are exposed. Due to an etch rate of the electrically insulating filler layer 236 being at least 100 times (or e.g. at least 500 times, or e.g. at least 1000 times) an etch rate of the first electrically insulating layer 307, the first electrically insulating layer 307 (and the bridge die 101) may serve as an etch stop during the etching. The electrically insulating filler structure 308 may be formed from (or may include) a portion of the electrically insulating filler layer 236 remaining in the gap after the etching process, for example.

Figure 2G:
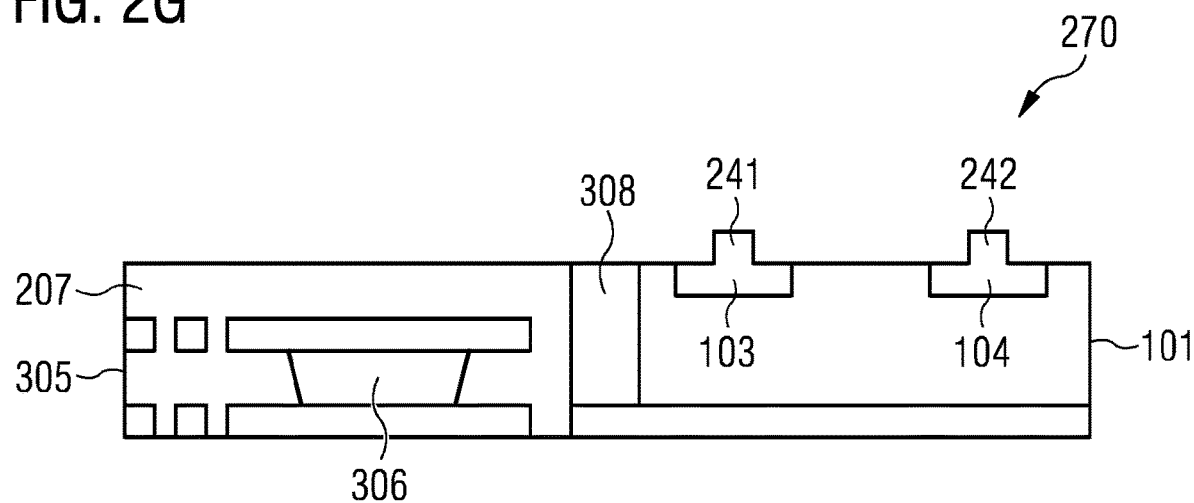

As shown in FIG. 2G, the method may include (in 270) forming a first via portion 241 on the first bridge die pad 103 and a second via portion 242 on the second bridge die pad 104 after forming the electrically insulating filler structure 308. The first via portion 241 and the second via portion 242 may be lithographic vias (LiV), which may be formed on the bridge die pads using HR lithography, for example. Following cavity etch back, the substrate may present a smooth surface where the dielectric build-up film cavity fill and bridge die are in the same plane. The lithographic via may then be ready to be patterned. First, a copper seed layer may be deposited on the substrate and then dry film resist (DFR) may be laminated on top of the Cu. The DFR may be exposed and developed to open up the via locations on the bridge die. The via may be formed using electrolytic copper plating and the DFR may then be stripped away. The seed layer may then be removed by an etching procedure.

Figure 2H:
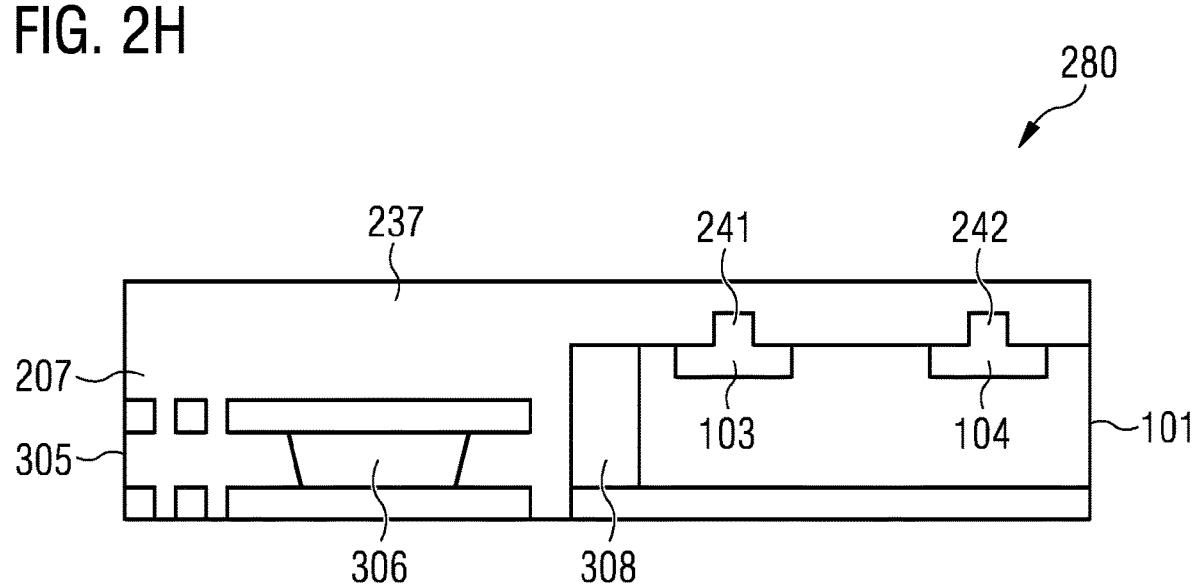
Figure 2I:
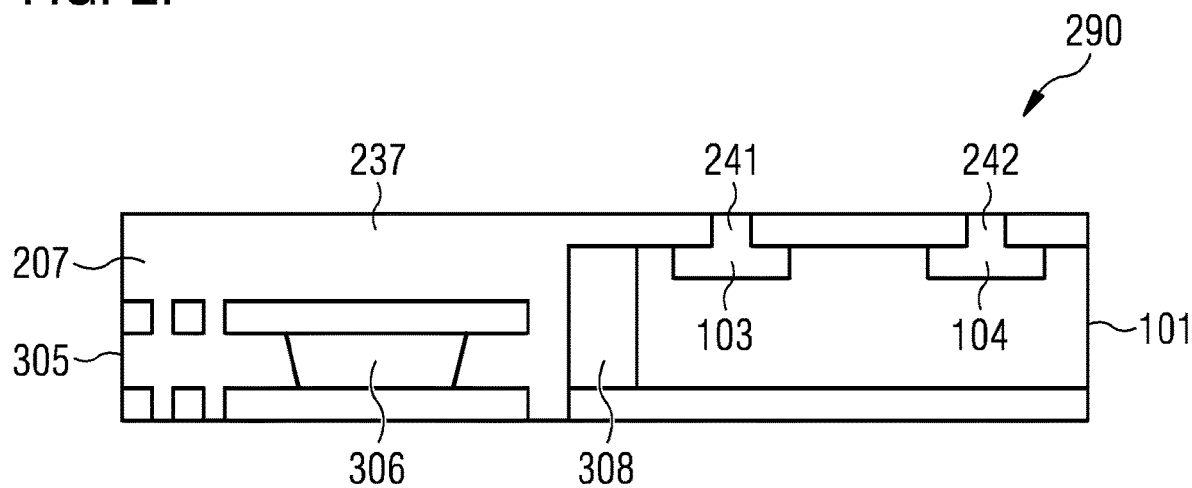

Once the via layer is formed, a dielectric build-up film may be laminated on top and then etched or polished down to uncover the via. This process may also serve to planarize the substrate to reduce the bump thickness variations (BTV) and meet the stringent requirements needed for such tight bump pitches. As shown in FIG. 2H, the method may include (in 280) forming a second electrically insulating layer 237 of the multilayer substrate structure 305 on the lateral surface of the multilayer substrate structure after forming the first via portion 241 and the second via portion 242. The second electrically insulating layer 237 may be the same material as the first electrically insulating layer 207. As shown in FIG. 2I, the method may include (in 290) planarizing (e.g. by chemical mechanical polishing CMP) a surface to expose (or e.g. reveal) the first via portion 241 and the second via portion 242 after forming the second electrically insulating layer 237.

Revealing of the vias may be carried out by wet etching, dry etching and/or polishing so that the Cu may be nearly flush with the dielectric build-p film layer. The via reveal may be carried out for example by polishing (15 µm Cu thickness) or grinding. Both processes may show good uniformity between Cu and the dielectric.

Figure 2J:
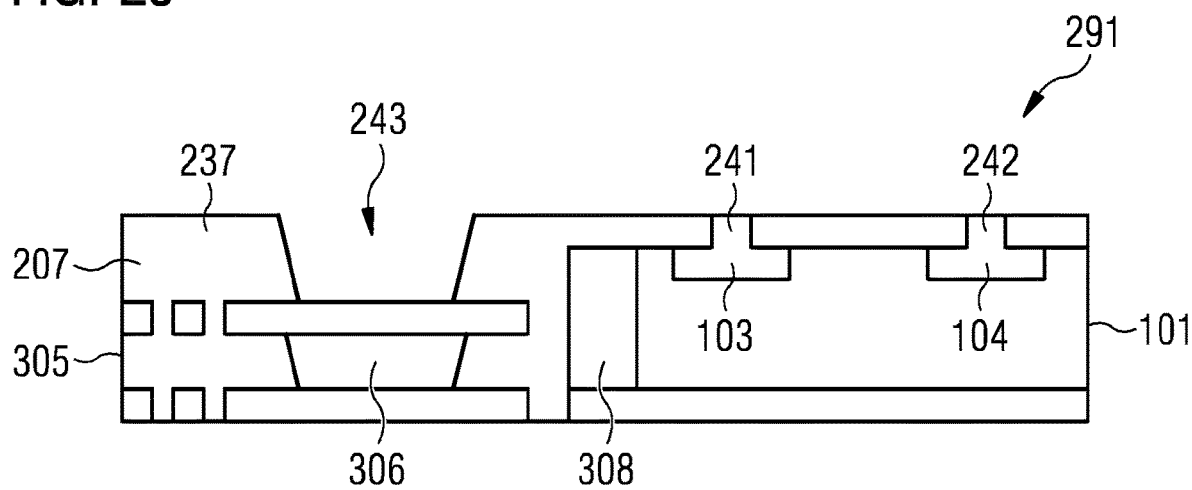
Figure 2K:
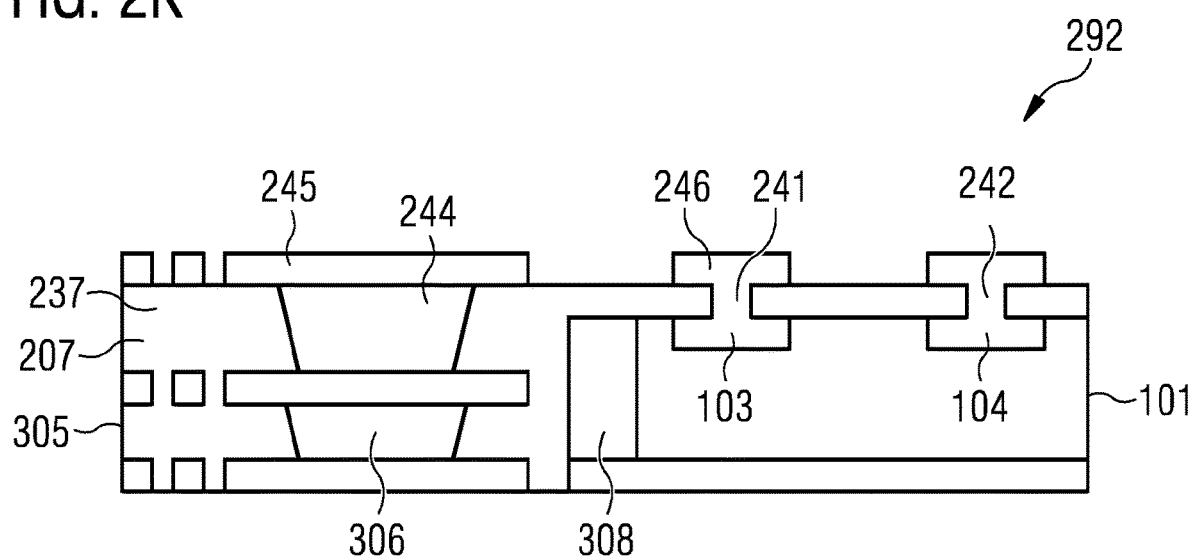

Subsequently, a large via 243 in the substrate may be formed with laser drilling and the substrate may be finished. As shown in FIGS. 2J to 2K, the method may include forming a first vertical wiring layer of the substrate interconnect after forming the first via portion 241 and the second via portion 242 (e.g. after planarizing the surface to expose the first via portion and the second via portion).

As shown in FIG. 2J, forming the first vertical wiring layer may include forming (in 291) an opening 243 to expose at least part of the substrate interconnect 306 (e.g. a lateral surface of the substrate interconnect) by a laser process. For example, the opening 243 may be formed by using laser drilling to from the opening 243 in the first electrically insulating layer 207 and the second electrically insulating layer 237. Additionally or optionally, a desmear process may be carried out after forming the opening to clean the opening 243, for example.

As shown in FIG. 2K, the method may include forming (in 292) the first vertical wiring layer 244, a first lateral wiring layer 245 of the substrate interconnect 306 and a first lateral wiring layer 246 of a bridge contact structure using a semi-additive process SAP with HR lithography. The first vertical wiring layer 244, the first lateral wiring layer 425 of the substrate interconnect 306 and the first lateral wiring layer 246 of the bridge contact structure may be formed simultaneously by depositing electrically conductive material in the openings formed during the lithographic process.

Figure 2L:
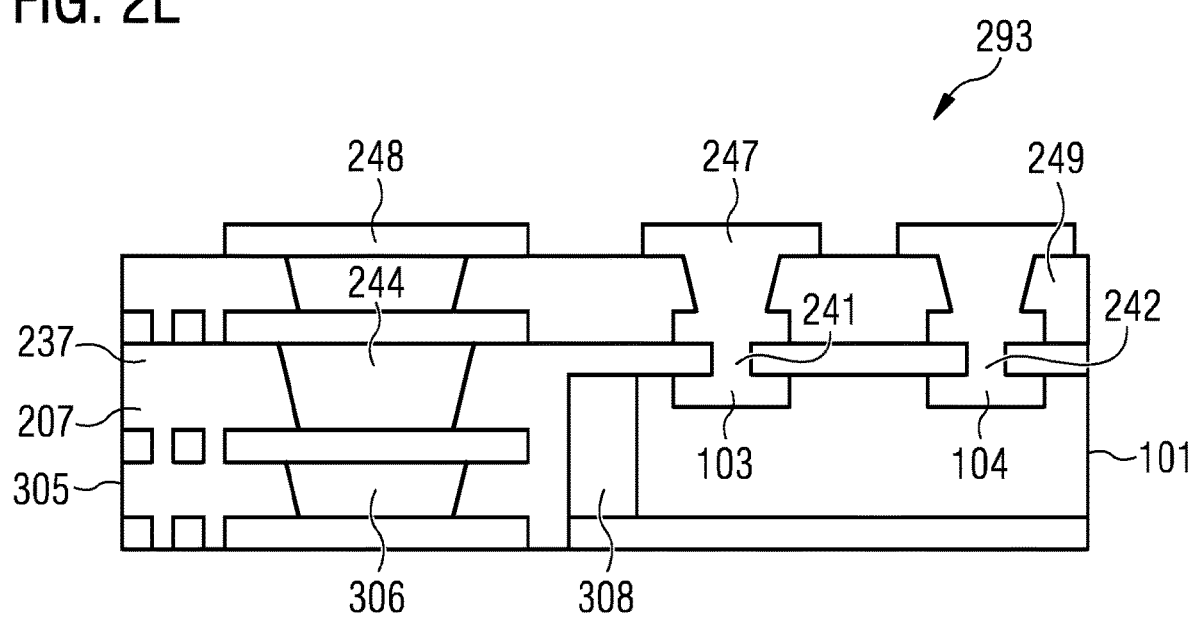

As shown in FIG. 2L, the method may include simultaneously forming at least a first contact interface structure 247 and a second contact interface structure 248 (first level interconnect FLI structures) after forming the first via portion 241, the second via portion 242 and the first vertical wiring layer 244. Forming the first contact interface structure 247 and the second contact interface structure 247 may include forming (e.g. laminating) a solder resist mask layer 249 at a lateral surface of the multilayer substrate structure 305 and removing portions of the solder resist mask layer 249 to form openings exposing the substrate interconnect and the bridge contact structure by a HR lithographic process. Forming the first contact interface structure 247 and the second contact interface structure 248 may further include forming (e.g. depositing) electrically conductive material in the openings of the mask layer to form the first contact interface structure 247 connected to the first bridge die and the second contact interface structure 248 connected to the substrate interconnect 306.

More details and aspects are mentioned in connection with the examples described above or below. The examples shown in FIGS. 2A to 2L may each comprise one or more optional additional features corresponding to one or more aspects mentioned in connection with the proposed concept or one or more examples described above (e.g. FIG. 1) or below (FIG. 3A to FIG. 5).

FIGS. 3A to 3F show schematic illustrations of at least part of a method 300 for forming a die interconnect substrate. For example, FIGS. 3A to 3F may show an alternative (or optional) process flow which may take advantage of the LiV process to enable both patterning and via formation on the same layer.

The method 300 may include the processes described in connections with FIGS. 2A to 2F. However, the method 300 may reduce the number of lithography processes by combining the EMIB via and routing on the same layer. After the cavity fill etch back process (shown in FIG. 2F), the (large) via may be drilled and then the EMIB via, routing, and large via may be plated up in the same process. The process may lead to via reveal on traces which may influence trace shape. However, both the large and small bump pitch portions of the substrate may be polished, further improving BTV. The may be finished with solder resist and the FLI may be formed by Cu plating.

Figure 3A:
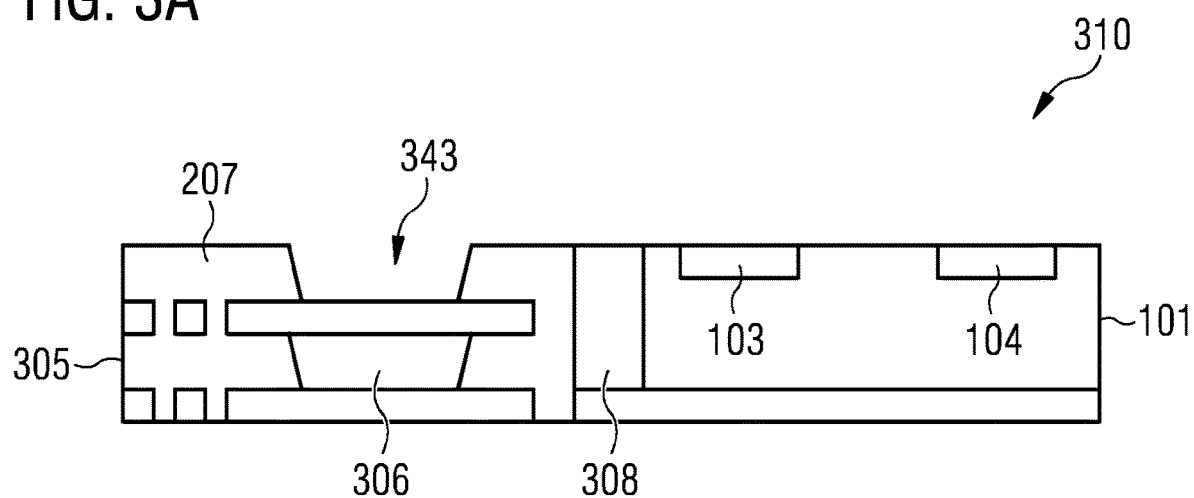
FIGS. 3A to 3F show schematic illustrations of a further method for forming a die interconnect substrate.

As shown in FIG. 3A, unlike in method 200, forming the first vertical wiring layer of the substrate interconnect is not carried out after forming the first via portion and the second via portion. Instead, the method 300 may include forming (in 310) an opening 343 to expose at least part of the substrate interconnect by a laser process. For example, the opening 343 may be formed by using laser drilling to from the opening 343 in the first electrically insulating layer 207 before depositing a subsequent second electrically insulating layer. Additionally or optionally, a desmear process may be carried out after forming the opening to clean the opening 343, for example.

Figure 3B:
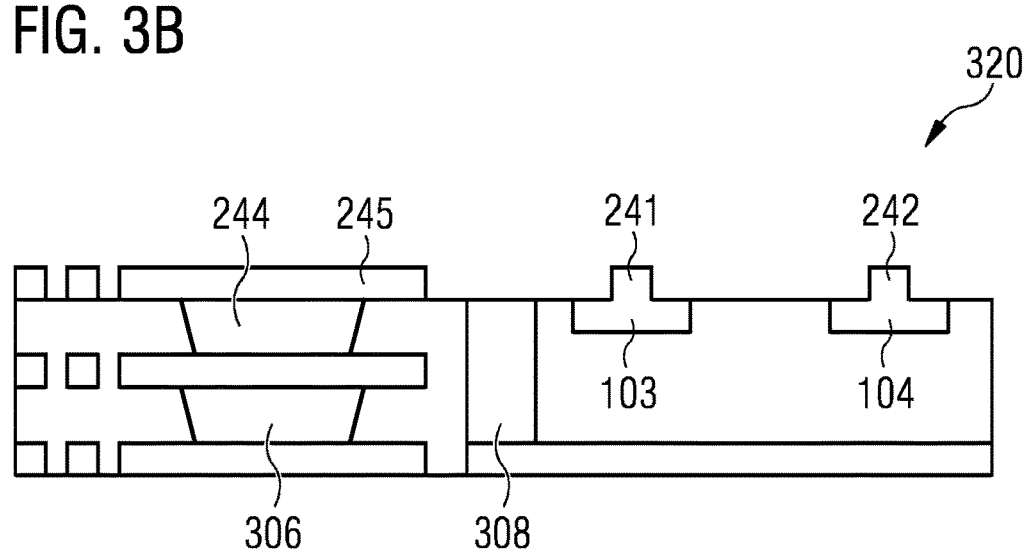

As shown in FIG. 3B, after forming the opening 343 in the first electrically insulating layer 207, the method 300 may include simultaneously forming the first vertical wiring layer 244, the first lateral wiring layer 245 of the substrate interconnect 306, the first via portion 241 and the second via portion 242 in the same lithographic process (e.g. using a semi-additive process SAP with HR lithography).

Figure 3C:
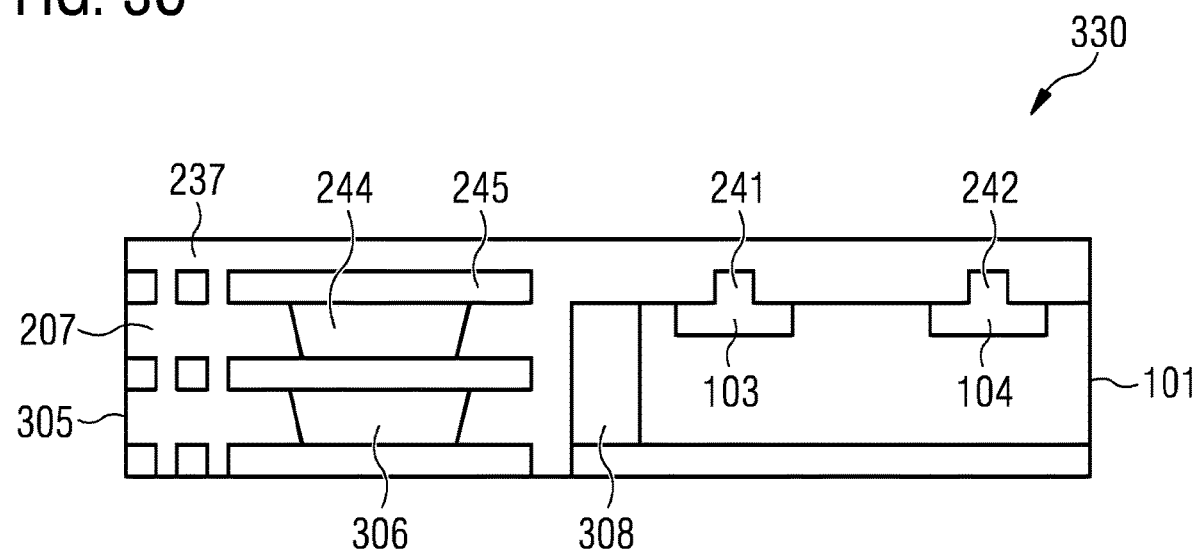

As shown in FIG. 3C, the method 300 may include forming the second electrically insulating layer 237 of the multilayer substrate structure 305 on the lateral surface of the multilayer substrate structure after forming the first vertical wiring layer 244. For example, the second dielectric build-up film layer may laminated on the lateral surface of the multilayer substrate structure.

Figure 3D:
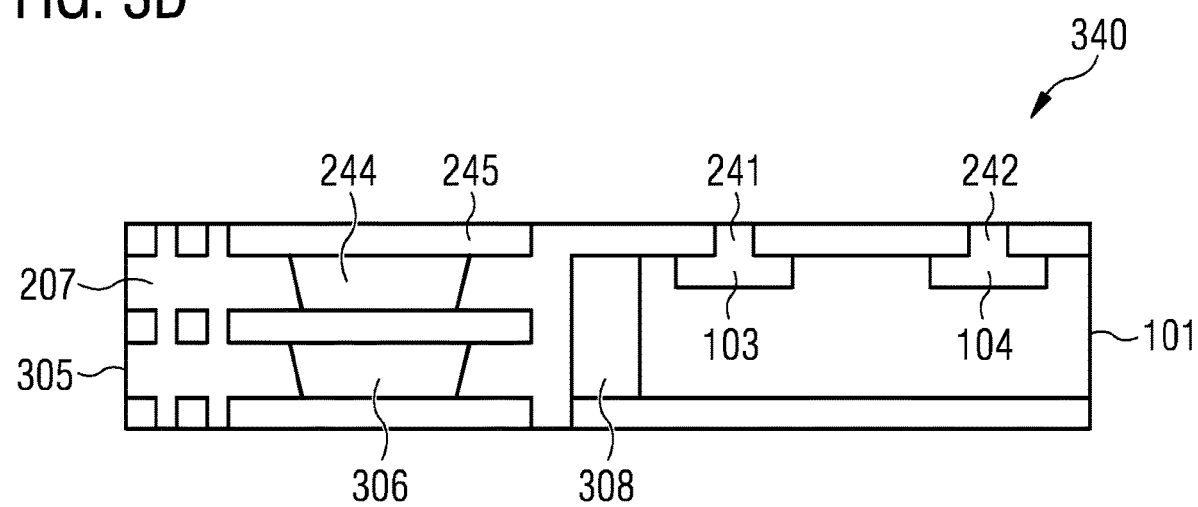

As shown in FIG. 3D, the method 300 may further include planarizing a lateral surface of the multilayer substrate structure 305 to expose (e.g. reveal) the first via portion 241, the second via portion 242 and the first lateral wiring layer 245 of the multilayer substrate structure 305 after forming the second electrically insulating layer.

Figure 3E:
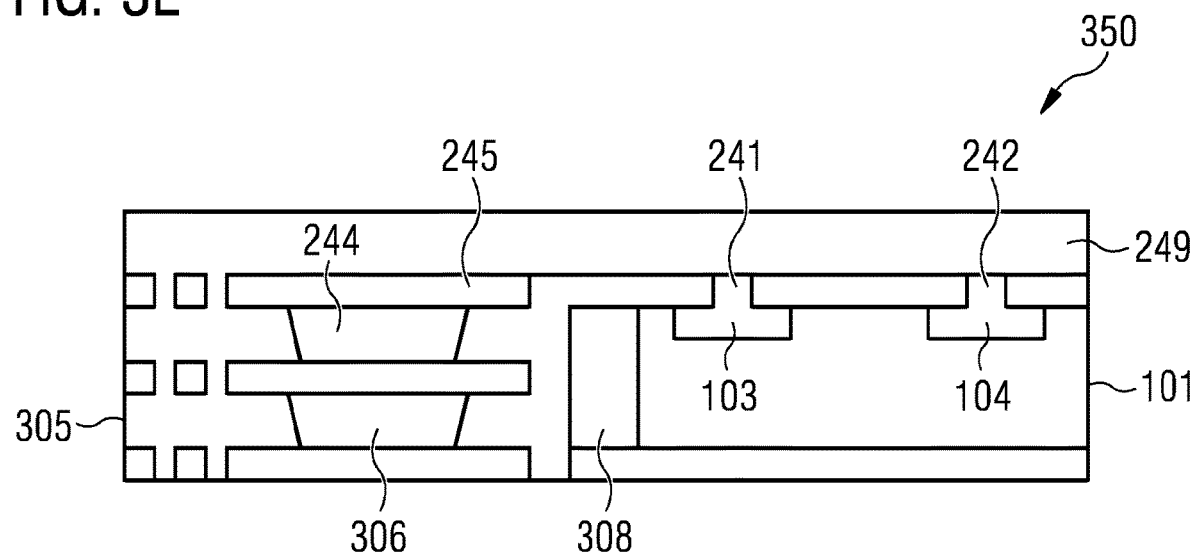
Figure 3F:
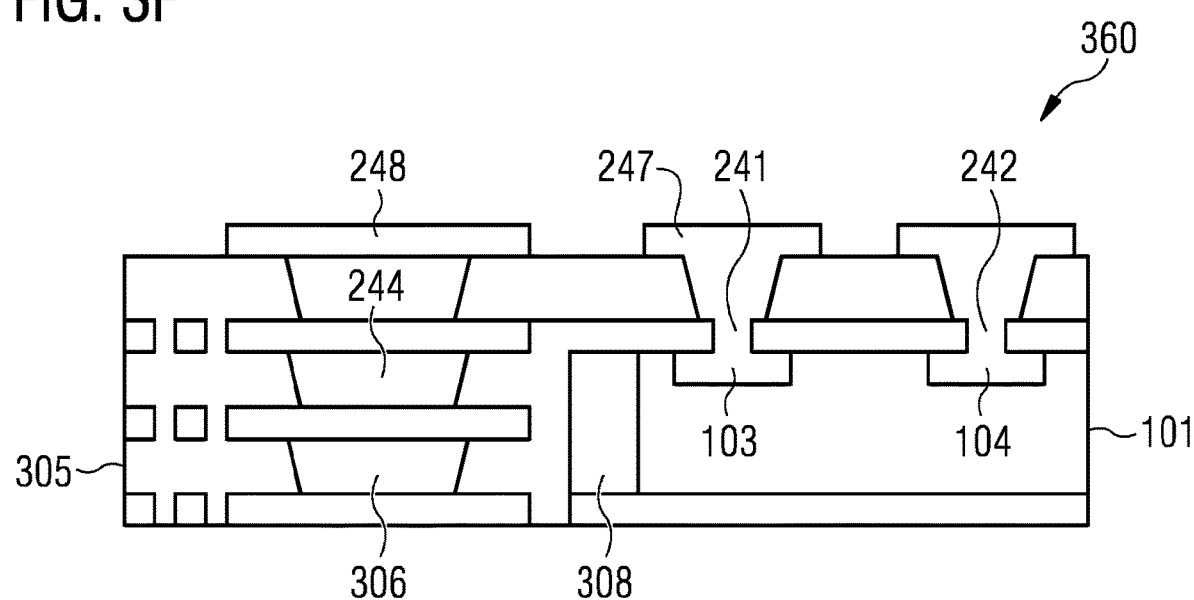

As shown in FIGS. 3E and 3F, the method 300 may include simultaneously forming at least the first contact interface structure 247 and the second contact interface structure 248 (first level interconnect FLI structures) after forming the first via portion 241, the second via portion 242 and the first vertical wiring layer 244.

As shown in FIG. 3E, forming the first contact interface structure 247 and the second contact interface structure 247 may include forming (e.g. laminating) a solder resist mask layer 249 at a lateral surface of the multilayer substrate structure 305 and removing portions of the solder resist mask layer 249 to form openings exposing the substrate interconnect and the bridge contact structure by a HR lithographic process.

As shown in FIG. 3F, forming the first contact interface structure 247 and the second contact interface structure 248 may further include forming electrically conductive material in the openings of the mask layer to form the first contact interface structure 247 connected to the first bridge die and the second contact interface structure 248 connected to the substrate interconnect 306.

More details and aspects are mentioned in connection with the examples described above or below. The examples shown in FIGS. 3A to 3F may each comprise one or more optional additional features corresponding to one or more aspects mentioned in connection with the proposed concept or one or more examples described above (e.g. FIGS. 1 to 2L) or below (FIG. 4A to FIG. 5).

Figure 4A:
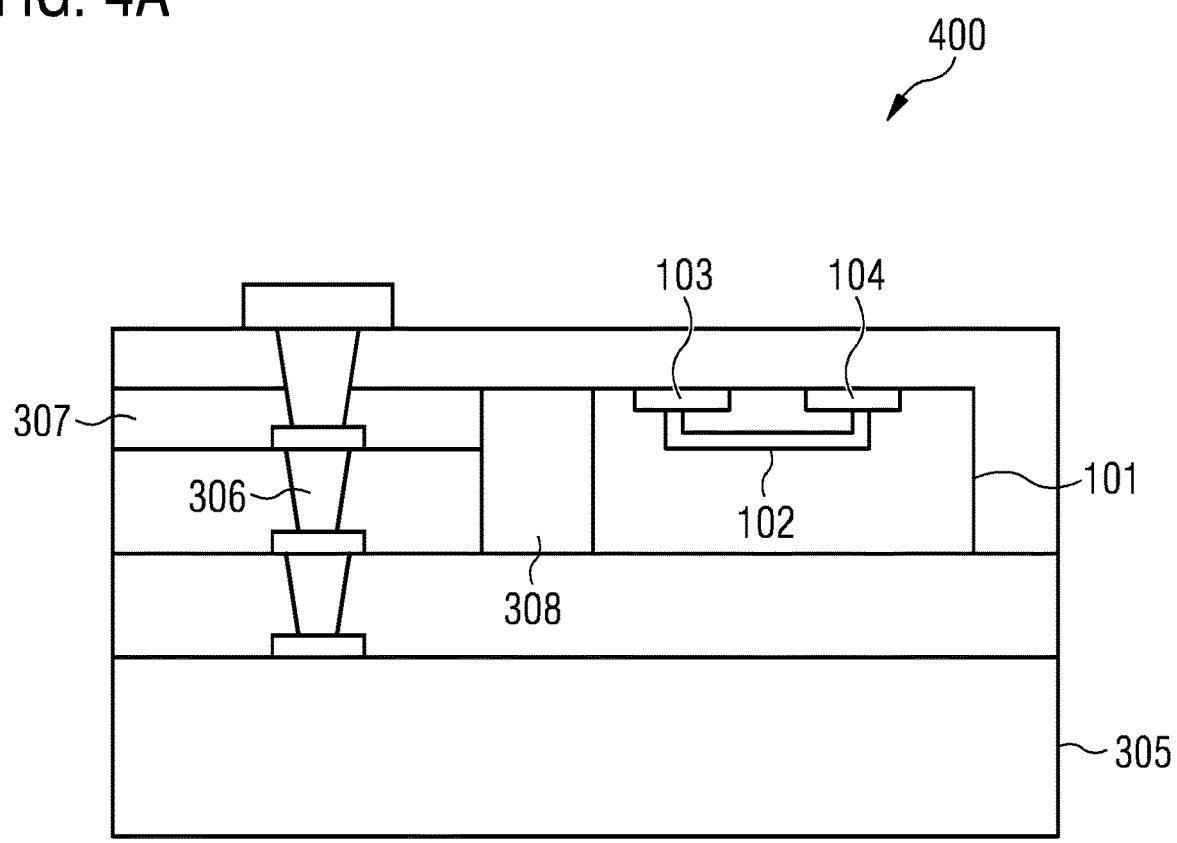
FIG. 4A shows a schematic illustration of a die interconnect substrate.
Figure 5:
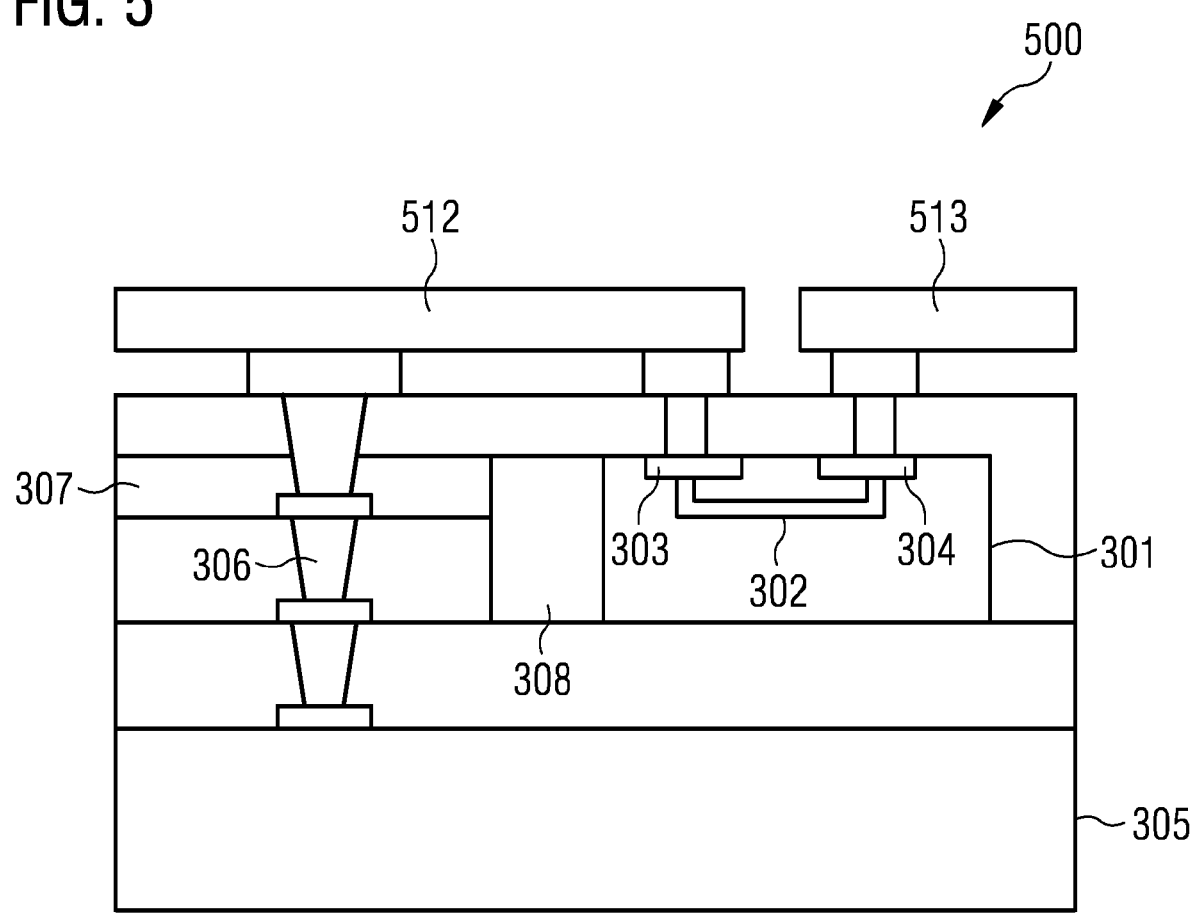
FIG. 5 shows a schematic illustration of an electrical device.

FIG. 4A shows a schematic illustration of at least part of a die interconnect substrate 400.

The die interconnect substrate 400 comprises a bridge die 101 comprising at least one bridge interconnect 102 connecting a first bridge die pad 103 of the bridge die to a second bridge die pad 104 of the bridge die.

The die interconnect substrate 400 further comprises a multilayer substrate structure 305 comprising a substrate interconnect 306. The bridge die 101 is embedded in the multilayer substrate structure 305, and the substrate interconnect 306 extends from a level above the bridge die to a level below the bridge die.

The multilayer substrate structure 305 further comprises an electrically insulating layer 307 comprising a first electrically insulating material.

The multilayer substrate structure 305 further comprises an electrically insulating filler structure 308 located laterally between the bridge die 101 and the electrically insulating layer 307. The electrically insulating filler structure 308 comprises a second electrically insulating material different from the first electrically insulating material.

Due to the electrically insulating filler structure 308 being located laterally between the bridge die 101 and the electrically insulating layer 307, the electrically insulating filler structure may form a level (or smooth) surface with the front surface of the bridge die and the electrically insulating layer. Thus, further wiring layers or via portions above the level of the bridge die may have more accurate placement. Additionally or optionally, the electrically insulating filler structure may provide improved adhesion of the bridge die 101 to the multilayer substrate structure 305 and may improve heat dissipation from the bridge die 101.

An average lateral dimension (e.g. an average width) of the electrically insulating filler structure may be larger than 5 μm. Additionally the average lateral dimension of the electrically insulating filler structure may be smaller than 15 μm. For example, the average lateral dimension of the electrically insulating filler structure may lie between 5 μm and 15 μm (or e.g. between 5 μm and 10 μm).

The electrically insulating filler structure 308 may extend from a level of the front surface of the bridge die 101 towards a level of the back surface of the bridge die 101. For example, the electrically insulating filler structure 308 does not reach a level higher than the level of the front surface of the bridge die 101. Optionally or additionally, a level of the front surface of the electrically insulating filler structure 308 varies from the level of the front surface of the bridge die 101 by less than 5% (or e.g. less than 3%, or e.g. less than 1%) of the thickness of the bridge die 101. The electrically insulating filler structure 308 may have a maximal vertical dimension (height) substantially equal to the maximal vertical dimension (height) of the bridge die 101. The electrically insulating filler structure may be a polyimide-based or epoxy-based filler structure. The electrically insulating filler structure may include filler particles (e.g. silica filler particles). The filler particles of the electrically insulating filler structure may be embedded in the polyimide or epoxy of the electrically insulating filler structure, for example. A (weight) concentration of filler particles of (or in) the electrically insulating filler structure may lie between 10% and 50% (or e.g. between 20% and 40%) of the weight of the electrically insulating filler structure. For example, the concentration filler particles in the electrically insulating filler structure may lie between 10 wt % and 50 wt % (or e.g. between 20 wt % and 40 wt %). Additionally or optionally, the build-up layers of the multilayer substrate structure may include filler particles (e.g. silica filler particles). The filler particles of the build-up layers of the multilayer substrate structure may be embedded in the laminate material of the build-up layers. A (weight) concentration of filler particles of (or in) the build-up layers of the multilayer substrate structure may lie between 50% and 80% (or e.g. between 60% and 70%) of the weight of the build-up layers of the multilayer substrate structure.

A maximal lateral dimension, l2, of the first via portion 241 may lie between 3 μm and 15 μm (or e.g. between 5 μm and 10 μm), for example. Very little to almost no tapering exists in the sidewalls of the via portion. For example, the sidewalls of the via portion may be substantially vertical. An average angle between a lateral surface of the bridge die and a sidewall of the via portion may lie between 85° and 95° (or e.g. between 87° and 93°). A lateral dimension of the first via portion 241 directly adjacent to the first bridge die pad 103 may be substantially equal to a lateral dimension of the first via portion 241 throughout the first via portion 241. For example, a lateral dimension of the first via portion 241 through the first via portion 241 varies from the lateral dimension of the first via portion 241 directly adjacent to the first bridge die pad 103 by less than 5% (or e.g. less than 3%, or e.g. less than 1%).

At least part of the electrically insulating layer 307 may be located between a level of the front surface of the bridge die 101 and a level of the back surface of the bridge die 101. Additionally or optionally, a lateral surface of the electrically insulating layer 307 may be at the level of the front surface of the bridge die 101. For example, the electrically insulating layer 307 and the front surface of the bridge die 101 may be substantially level with each other.

The electrically insulating (e.g. dielectric) layer 307 may be a build-up film layer. The electrically insulating layer 307 may be one of a plurality of electrically insulating (build-up) layers forming at least part of an electrically insulating substrate of the multilayer substrate structure. The die interconnect substrate may further include a second electrically insulating layer formed on the first electrically insulating layer and the bridge die. The second electrically insulating layer may be (or may include) the same material as the first electrically insulating layer 307.

The bridge die 101 may be an embedded multi-die interconnect bridge (EMIB) die. For example, the bridge die 101 may provide one or more electrical interconnections between multiple semiconductor dies (See FIG. 5). The bridge die 101 may include a plurality of bridge die pads 103, 104 and a plurality of bridge interconnects 102. Additionally or optionally, the first bridge die pad 103 may be one bridge die pad 103 of first group (or plurality) of bridge die pads of all the bridge die pads of the bridge die 101. The first group of bridge die pads may be located within a first lateral region of the bridge die 101. The first group of bridge die pads may each be ohmically or electrically connected to the same (first) semiconductor die via interface structures individually ohmically or electrically connected to each bridge die pad of the first group of bridge die pads. The second bridge die pad 104 may be one bridge die pad 104 of second group (or plurality) of bridge die pads of all the bridge die pads of the bridge die 101. The second group of bridge die pads may be located within a second lateral region of the bridge die 101 which is different from the first lateral region of the bridge die 101. The second group of bridge die pads may each be ohmically or electrically connected to the same (second) semiconductor die via interface structures individually connected to each bridge die pad of the second group of bridge die pads.

Each bridge interconnect 102 may provide a route for an electrical signal. As shown in FIG. 4A, one bridge interconnect 102 may connect a first bridge die pad 103 of the first group of bridge die pads to a second bridge die pad 104 of the second group of bridge die pads. Since the first bridge die pad 103 may be connected to a first semiconductor die via a first contact interface structure, and the second bridge die pad 104 may be connected to a second semiconductor die via a second contact interface structure, the bridge interconnect 102 may provide a route for an electrical signal between the first semiconductor die and the second semiconductor die. Additionally or optionally, one or more further bridge interconnects 102 may each be configured to provide an electrical route between another bridge die pad of the first group of bridge die pads to another bridge die pad of the second group of bridge die pads. Additionally or optionally, at least one other bridge interconnect 102 may be configured to provide a route for an electrical signal from a bridge die pad to a substrate interconnect 306 of the multilayer substrate structure 305. Since the bridge interconnects of the bridge die may provide an electrical route between a first semiconductor die and a second semiconductor die, the die interconnect substrate may be referred to as a die-to-die interconnect substrate.

The bridge die 101 may be embedded in the multilayer substrate structure 305. For example, the bridge die 101 may be located in a cavity of the multilayer substrate structure 305. One or more electrically insulating layers of the multilayer substrate structure 305 may be located around (e.g. formed laterally around) the bridge die 101 so that the bridge die may be electrically insulated from the substrate interconnects 306 of the multilayer substrate structure 305. At least part of an electrically insulating layer of the multilayer substrate structure may be located laterally around the bridge die 101 (e.g. on sidewalls of the bridge die 101) and/or may cover the back side and/or front side of the bridge die 101.

Optionally, the first bridge die pad 103 and the second bridge die pad 104 may be located at a front side of the bridge die 101.

The bridge die 101 may include a substrate die, which may be a glass die or a (high resistivity) silicon die. The plurality of bridge interconnects 102 may be routed through at least part of the bridge die 101. For example, a bridge interconnect 102 may include a first vertically extending portion connecting the first die pad 103 to a laterally extending portion of the bridge interconnect 102. The bridge interconnect 102 may further include a second vertically extending portion connecting the laterally extending portion to the second die pad 104. By repeating the processes of forming a lateral extending portion on a surface of the substrate die, depositing an electrically insulating bridge substrate material and forming a vertically extending portion, the plurality of bridge interconnects 102 may be formed. Each bridge interconnect 102 may be electrically insulated from other bridge interconnects 102 by the electrically insulating bridge substrate material located between the bridge interconnects 102. The electrically insulating bridge substrate material may include silicon dioxide, high resistivity silicon or glass, for example. A thickness of the bridge die 101 may be less than 100 µm (or e.g. between 25 µm and 100 µm, or e.g. between 50 µm and 80 µm). Optionally, the bridge die 101 may be primarily (or solely) for routing electrical signals. For example, no transistors may be implemented on the bridge die 101 and/or the bridge die 101 may have no electrically active doping regions. For example, the implantation of dopants into the bridge die 101 may be unnecessary, if no transistors and diodes are implemented on the on the bridge die 101.

Each substrate interconnect may be configured to provide a route for an electrical signal, which may be carried or relayed through the multilayer substrate structure by the substrate interconnect. The plurality of substrate interconnects may extend through at least part of the electrically insulating substrate. For example, one or more substrate interconnects of the plurality of substrate interconnects may extend (substantially vertically) through the electrically insulating substrate from a front side of the multilayer substrate structure towards (or to) the back surface of the multilayer substrate structure. A portion of each substrate interconnect may lie at a level above the bridge die and a further portion of the substrate interconnect may lie at a level below the bridge die. Additionally or optionally, one or more further substrate interconnects of the plurality of substrate interconnects may extend from the front side of the multilayer substrate structure towards the back surface of the multilayer substrate structure, but may end before reaching the back surface of the multilayer substrate structure. Additionally or optionally, one or more substrate interconnects of the plurality of substrate interconnects may be ohmically or electrically connected to other substrate interconnects of the multilayer substrate structure.

Depending on the desired wiring layout, a lateral wiring layer of a first substrate interconnect may be ohmically or electrically connected (at the same lateral level) to a lateral wiring layer of a second substrate interconnect. In this way, an electrical signal may be routed between the first substrate interconnect and the second substrate interconnect.

The (or each) substrate interconnect may be electrically insulated from the bridge die by at least part of the electrically insulating substrate. For example, at least part of the electrically insulating substrate of the multilayer substrate structure 305 may be located between the bridge die and the substrate interconnect. For example, at least part of the electrically insulating substrate may surround (e.g. laterally surround) the substrate interconnect.

The die interconnect substrate 400 may further include a plurality of first contact interface structures, which may each be connected to a bridge die pad of the bridge die 101. Optionally, the plurality of first contact interface structures may each be connected to the bridge die pads of the first group of bridge die pads. The die interconnect substrate may further include a plurality of second contact interface structures, which may each be connected to a substrate interconnect of the multilayer substrate structure 305. The plurality of first contact interface structures and the plurality of second contact interface structures may be located at the front side of the multilayer substrate structure 305. The plurality of first contact interface structures and the plurality of second contact interface structures may be copper (Cu)-based interface structures.

Each first (contact) interface structure may be (or may include at least part of) a solder bump structure for providing an ohmic or electrical contact to a semiconductor die. Similarly, each second (contact) interface structure may be (or may include at least part of) a different solder bump structure for providing an ohmic or electrical contact to a semiconductor die. For example, the first contact interface structure and the second contact interface structure may each be configured for attaching a semiconductor die to the multilayer substrate structure 305 via a controlled collapse chip connection C4 (e.g. a flip chip connection).

Both the first contact interface structure and the second contact interface structure may protrude from (or may be exposed at) the front surface of the multilayer substrate structure 305. Additionally, the die interconnect substrate may include a surface finish layer which may be located at the lateral surface of the first contact interface structure and at the lateral surface of the second contact interface structure. Thus, the multilayer substrate structure 305 may be attached (or e.g. soldered to) a semiconductor die via the first contact interface structure and the second contact interface structure. Optionally, the first contact interface structure and the second contact interface structure may be attached to the same semiconductor die. However, alternatively, it may be possible that the first contact interface structure may be attached to a first semiconductor die and the second contact interface structure may be attached to a second semiconductor die.

The die interconnect substrate 400 may further include a plurality of third interface structures located at the back surface of the multilayer substrate structure 305. The plurality of third interface structures may be for attaching the multilayer substrate structure 305 to a carrier (e.g. to a printed circuit board) at the back surface of the multilayer substrate structure 305. Optionally, one or more substrate interconnects 306 of the multilayer substrate structure 305 may be further connected to the third interface structure. For example, one or more substrate interconnects 306 may each be connected between a second contact interface structure at the front surface of the multilayer substrate structure 305 and the third interface structure at the back surface of the multilayer substrate structure.

Additionally, or optionally, the die interconnect substrate 400 may further include a fourth interface structure located at the front surface of the multilayer substrate structure 305 for attaching a passive component to the multilayer substrate structure 305. Alternatively, the passive component may be a capacitor (e.g. a die side capacitor DSC) or a host fabric interface (HFI). Optionally, the die interconnect substrate 400 may include a fourth interface structure for attaching a DSC to the multilayer substrate structure 305, and a fifth interface structure for attaching a HFI to the multilayer substrate structure 305. Generally, besides semiconductor dies, one or more other structures may be connected to one or more front side (or back side) contact interface structures. The one or more other structures may be a processor circuit (e.g. central processing unit CPU), a memory circuit, a (wireless or wireline) transmitter circuit and/or a (wireless or wireline) receiver circuit implemented on a semiconductor die.

A lateral surface (e.g. of the bridge die, or a substrate) may be a substantially even plane (e.g. neglecting unevenness of the die due to the manufacturing process and trenches). The lateral surface may be substantially perpendicular (or orthogonal) to a vertical edge of the die. For example, in comparison to a (substantially vertical or orthogonal) edge of the die, the lateral surface may be a basically horizontal surface extending laterally. The lateral dimension of the lateral surface of the die may be more than 100 times larger (or more than 1000 times or more than 10000 times) than a basically vertical dimension (or height) of a vertical edge of the die, for example. A lateral dimension or lateral distance may be a dimension or distance measured in a direction substantially horizontal to the lateral surface of the die.

Figure 4B:
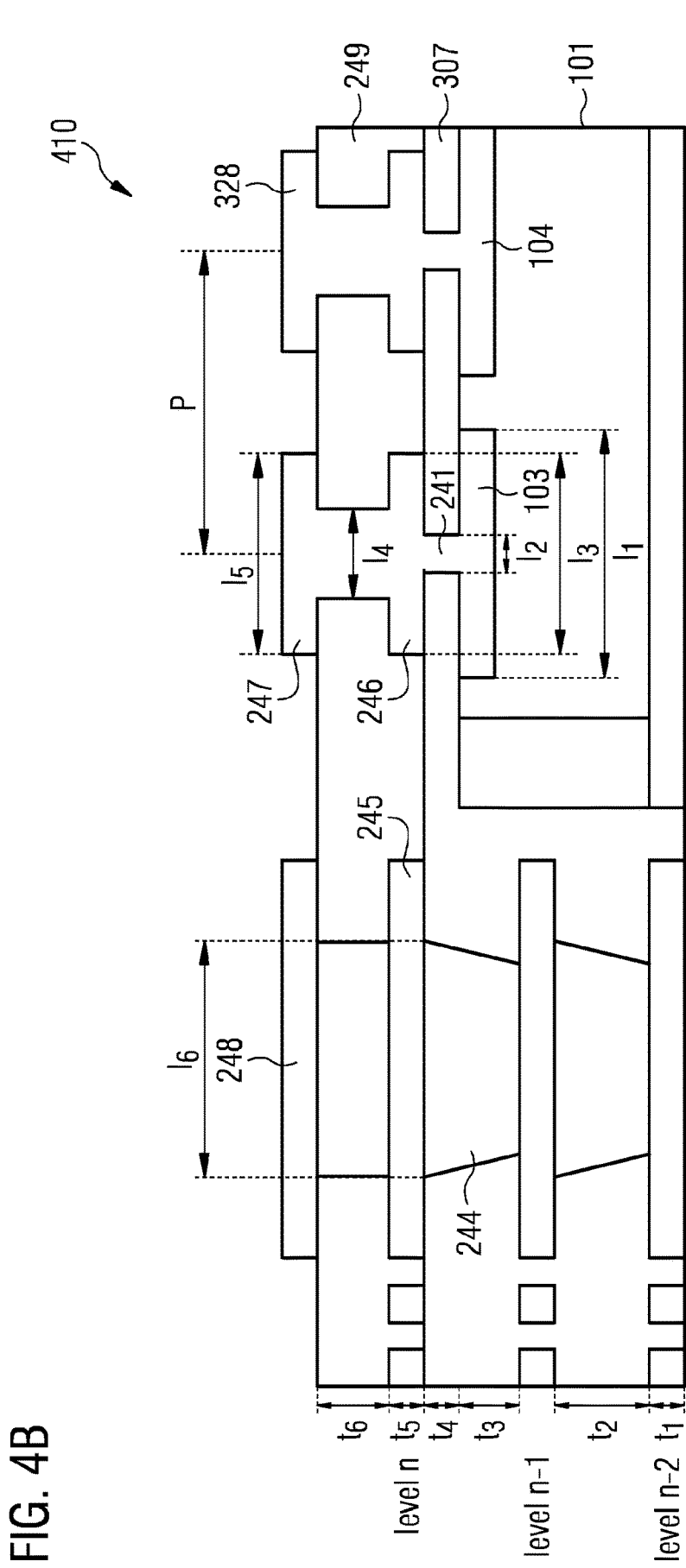
FIGS. 4B to 4C show possible dimensions of a die interconnect substrate.
Figure 4C:
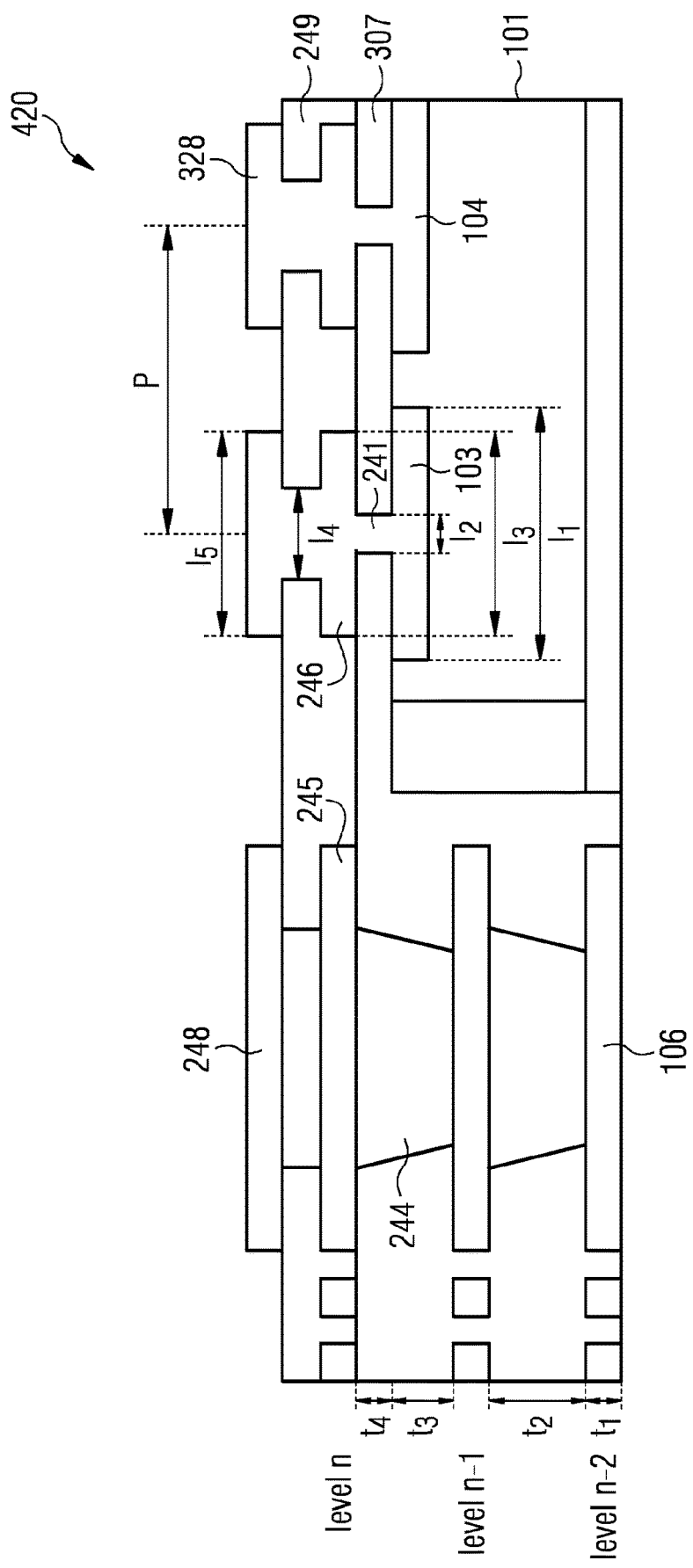

FIGS. 4B and 4C show examples of possible dimensions of a die interconnect substrate 410. For example, FIG. 4B shows an example stackup showing preliminary layer thickness and pad/via diameter for a 40 µm EMIB bump pitch and FIG. 4C shows an example stackup showing preliminary layer thickness and pad/via diameter for a 30 µm EMIB bump pitch.#

The die interconnect substrates 410, 420 may each include a bridge die 101, which may include a first bridge die pad 103 and a second bridge die pad 104. A maximal lateral dimension, l1, of a bridge die pad may lie between 20 µm and 40 µm (or e.g. between 20 µm and 35 µm, or e.g. between 25 µm and 35 µm), for example.

The die interconnect substrate 310 may include a first via portion 241 of a bridge contact structure formed directly on the first bridge die pad. A maximal lateral dimension, l2, of the first via portion 241 may lie between 3 µm and 15 µm (or e.g. between 5 µm and 10 µm), for example.

The bridge contact structure may further include a first lateral wiring layer 246 directly connected to the first via portion 241. A maximal lateral dimension, l3, of the first lateral wiring layer 245 may lie between 15 µm and 30 µm (or e.g. between 18 µm and 28 µm), for example.

The die interconnect substrate 410, 420 may further include a first contact interface structure 247.

A minimal (or smallest) lateral dimension, l4, of the first contact interface structure 247 may lie between 15 µm and 20 µm (or e.g. between 15 µm and 18 µm), for example.

A maximal lateral dimension, l5, of the first contact interface structure 247 may lie between 15 µm and 30 µm (or e.g. between 18 µm and 28 µm), for example.

A maximal lateral dimension, l6, of the vertical wiring layer may be larger than 30 µm (or e.g. larger than 40 µm, or e.g. larger than 45 µm). For example, the maximal lateral dimension, l6, of the vertical wiring layer may be at least 1.5 times (or e.g. at least 2 times, or e.g. at least 3 times, or e.g. at least 5 times, or e.g. at least 10 times) the maximal lateral dimension, l2, of the first via portion 241.

A (vertical) thickness t1, t5, of a lateral wiring layer of the substrate interconnect may be between 5 µm and 20 µm (or e.g. between 10 µm and 15 µm), for example.

A (vertical) thickness, t2, t3 of an electrically insulating build up layer of the multilayer substrate structure which is not planarized or etched may be between 10 µm and 35 µm (or e.g. between 15 µm and 30 µm), for example.

A (vertical) thickness, t4, of an electrically insulating build up layer laterally surrounding the via portion may be between 2 µm and 10 µm (or e.g. between 3 µm and 6 µm), for example.

A (vertical) thickness, t6, of a solder resist layer above the first lateral wiring layer 245 may be between 10 µm and 35 µm (or e.g. between 15 µm and 30 µm), for example.

A bump pitch may be a distance between a center of a contact interface structure and a center of an adjacent contact interface structure, for example. The bump pitch, p, between two adjacent first contact interface structures may lie between 30 µm and 45 µm (or e.g. between 30 µm and 40 µm), for example. Additionally or optionally, a minimal (or smallest) distance between adjacent interface structures of the plurality of first contact interface structures may be less than 30 µm (or e.g. less than 25 µm, or e.g. less than 30 µm). A minimal (or smallest) distance between adjacent interface structures of the plurality of second contact interface structures may be larger than 30 µm (or e.g. larger than 40 µm, or e.g. larger than 50 µm).

A maximal (or largest) lateral dimension (e.g. a width) of the first contact interface structure may be smaller than the second contact interface structure. For example, a maximal lateral dimension of the second contact interface structure may be at least 1.5 times (or e.g. 2 times, or e.g. 3 times) a maximal lateral dimension of the first contact interface structure.

A thickness of the multilayer substrate structure 305 may be at least 700 µm (or e.g. at least 900 µm, or e.g. at least 1 mm). For example, the thickness of the multilayer substrate structure 305 may be a (vertical) distance between a lateral surface of the first contact interface structure located at the front side of the multilayer substrate structure 305 and a lateral surface of a third interface structure located at the back side of the multilayer substrate structure 305.

Example stackups may be shown for both die interconnect substrates with 40 µm and 30 µm bump pitch. Pad to pad spacing on the FLI may be critical for assembly yield, therefore the pad spacing may be 12 μm. This may result in a 28 μm pad for the 40 μm BP example and an 18 μm pad for the 30 μm BP example. High resolution lithography tools may achieve litho-to-litho alignment of less than 6 μm (e.g. with 1 μm um tool overlay accuracy. Assuming +/−6 μm alignment gives 16 um SRO in the 40 μm BP example and 6 μm in the 30 μm BP example. The via 241 formed for EMIB die to substrate layer n may be significantly smaller than the pad to account for both lithography and die placement alignment. For example, a 10 μm via 241 may be suitable for a +/−8 μm lithography alignment. The 30 μm BP example may have a 5 μm via 241 with a +/−6 μm lithography alignment and a +/−0.5 μm improvement in die placement accuracy. For the 30 μm BP example, the SRO may be 6 μm and the SR thickness may be 10 μm. The copper thickness may be 10 μm so that reliable lamination can be achieved.

As shown in FIG. 4B, a die interconnect substrate 410 may have the following dimensions. A bump pith, p, between two adjacent first contact interface structures may be 40 μm. Additionally, a maximal lateral dimension (or width), 11, of a bridge die pad may be 35 μm. Additionally, a maximal lateral dimension (or width), 12, of the first via portion 241 may be 10 μm. Additionally, a maximal lateral dimension (or width), 13, of the first lateral wiring layer 245 may be 28 μm. Additionally, minimal lateral dimension (or width), 14, of the first contact interface structure 247 may be 16 μm. Additionally, a maximal lateral dimension (or width), 15, of the first contact interface structure 247 may be 28 μm. Additionally, a (vertical) thickness t1 a lateral wiring layer (at level n-2 and/or at level n-1) of the substrate interconnect 106 may be 15 μm. Additionally, a (vertical) thickness, t2, of an electrically insulating build up layer of the multilayer substrate structure between level n-2 and level n-1 may be 30 μm. Additionally, a (vertical) thickness, t3, of an electrically insulating build up layer of the multilayer substrate structure between level n-1 and level n may be 15 μm. Additionally, a (vertical) thickness, t4, of an electrically insulating build up layer laterally surrounding the via portion 241 may be 10 μm. Additionally, a (vertical) thickness t5, a lateral wiring layer (at level n) of the substrate interconnect 106 may be 10 μm. Additionally, a (vertical) thickness, t6, of a solder resist layer above the first lateral wiring layer 245 may be 10 μm.

As shown in FIG. 4C, a die interconnect substrate 420 may have the following dimensions. A bump pith, p, between two adjacent first contact interface structures may be 30 μm. Additionally, a maximal lateral dimension (or width), 11, of a bridge die pad may be 25 μm. Additionally, a maximal lateral dimension (or width), 12, of the first via portion 241 may be 5 μm. Additionally, a maximal lateral dimension (or width), 13, of the first lateral wiring layer 245 may be 18 μm. Additionally, minimal lateral dimension (or width), 14, of the first contact interface structure 247 may be 16 μm. Additionally, a maximal lateral dimension (or width), 15, of the first contact interface structure 247 may be 18 μm. Additionally, a (vertical) thickness t1 a lateral wiring layer (at level n-2 and/or at level n-1) of the substrate interconnect 106 may be 15 μm. Additionally, a (vertical) thickness, t2, of an electrically insulating build up layer of the multilayer substrate structure between level n-2 and level n-1 may be 30 μm. Additionally, a (vertical) thickness, t3, of an electrically insulating build up layer of the multilayer substrate structure between level n-1 and level n may be 15 μm. Additionally, a (vertical) thickness, t4, of an electrically insulating build up layer laterally surrounding the via portion 241 may be between 5 μm. Additionally, a (vertical) thickness t5, a lateral wiring layer (at level n) of the substrate interconnect 106 may be 10 μm. Additionally, a (vertical) thickness, t6, of a solder resist layer above the first lateral wiring layer 245 may be 10 μm.

More details and aspects are mentioned in connection with the examples described above or below. The examples shown in FIGS. 4A to 4C may each comprise one or more optional additional features corresponding to one or more aspects mentioned in connection with the proposed concept or one or more examples described above (e.g. FIGS. 1 to 3F) or below (FIG. 5).

FIG. 5 shows a schematic illustration of an electrical device 500.

The electrical device 500 comprises a die interconnect substrate.

The die interconnect substrate comprises a bridge die comprising at least one bridge interconnect 102 connecting a first bridge die pad 103 of the bridge die to a second bridge die pad 104 of the bridge die.

The electrical device 500 comprises a first semiconductor device 512 connected to the first bridge die pad.

The electrical device 500 further comprises a second semiconductor device 513 connected to the second bridge die pad.

The die interconnect substrate further comprises a multilayer substrate structure 305 comprising a substrate interconnect 306. The bridge die 101 is embedded in the multilayer substrate structure 305, and the substrate interconnect 306 extends from a level above the bridge die to a level below the bridge die.

The multilayer substrate structure 305 further comprises an electrically insulating layer 307 comprising a first electrically insulating material.

The multilayer substrate structure 305 further comprises an electrically insulating filler structure 308 located laterally between the bridge die 101 and the electrically insulating layer 307. The electrically insulating filler structure 308 comprises a second electrically insulating material different from the first electrically insulating material.

Due to the electrically insulating filler structure 308 being located laterally between the bridge die 101 and the electrically insulating layer 307, the electrically insulating filler structure may form a level (or smooth) surface with the front surface of the bridge die and the electrically insulating layer. Thus, further wiring layers or via portions above the level of the bridge die may have more accurate placement. Additionally or optionally, the electrically insulating filler structure may provide improved adhesion of the bridge die 101 to the multilayer substrate structure 305 and may improve heat dissipation from the bridge die 101.

The first semiconductor device 512 and the second semiconductor device 513 may respectively (or may be) a processor circuit (e.g. central processing unit CPU), a memory circuit, a (wireless or wireline) transmitter circuit and/or a (wireless or wireline) receiver circuit implemented on a semiconductor die. Alternatively, or optionally the first semiconductor device 512 and the second semiconductor device 513 may be a passive component such as a capacitor (e.g. a die side capacitor DSC) or a host fabric interface (HFI).

The die interconnect substrate, the first semiconductor device 512 and the second semiconductor device 513 may be arranged in a common (e.g. the same) semiconductor package. The components of the electrical device may be embedded in the semiconductor package. For example, the components of the electrical device such as the die interconnect substrate and the semiconductor devices may be partially or fully surrounded by a package material. The package material may be an epoxy, a plastic and/or a mold compound, for example. Optionally, the carrier structure may be a package substrate of the common semiconductor package.

A plurality of back side (third) contact interface structures of the die interconnect substrate may be located at the back side of the die interconnect substrate for connecting the electrical device (and/or the semiconductor package) to an external carrier structure (e.g. to a printed circuit board PCB), for example. The plurality of back side contact interface structures may be connected to the plurality of substrate interconnects of the multilayer substrate structure, for example. The plurality of back side contact interface structures may be solder bumps (e.g. ball grid array bumps). The die interconnect substrate of the semiconductor package may be connected to the external carrier structure. The carrier structure may be an organic substrate (e.g. package carrier substrate or printed circuit board PCB). The carrier structure may be soldered to (e.g. all back side contact interface structure of) the plurality of back side contact interface structures forming solder connections between the carrier structure and the die interconnect substrate.

More details and aspects are mentioned in connection with the examples described above or below. The examples shown in FIG. 5 may comprise one or more optional additional features corresponding to one or more aspects mentioned in connection with the proposed concept or one or more examples described above (e.g. FIGS. 1 to 4C) or below.

Various examples relate to an integrated bridge with dielectric build-up film lithographic via for EMIB bump pitch scaling. The examples may be used to efficiently integrate disparate die with very fine bump pitch onto an organic substrate. Applications may range from integration of high bandwidth memory into high performance computing applications to die stitching for cost reduction.

The aspects and features (e.g. the die interconnect substrate, the bridge die, the at least one bridge interconnect, the first bridge die pad, the second bridge die pad, the multilayer substrate structure, the substrate interconnect, the electrically insulating layer, the via portion, the first vertical wiring layer, the vertical wiring layers, the lateral wiring layers, the electrically insulating filler structure, the first contact interface structure, the semiconductor die, the second contact interface structure, the surface finish layer, the bridge contact structure, the third interface structure and the fourth interface structure) mentioned and described together with one or more of the previously detailed examples and figures, may as well be combined with one or more of the other examples in order to replace a like feature of the other example or in order to additionally introduce the feature to the other example.

There is a demand to provide concepts for semiconductor devices with fine bump pitch for high bandwidth memory applications and/or with high performance computing capabilities.

In the following, examples pertain to further examples.

Example 1 is a die interconnect substrate, comprising: a bridge die comprising at least one bridge interconnect connecting a first bridge die pad of the bridge die to a second bridge die pad of the bridge die; and a multilayer substrate structure comprising a substrate interconnect, wherein the bridge die is embedded in the multilayer substrate structure, and wherein the substrate interconnect extends from a level above the bridge die to a level below the bridge die, wherein the multilayer substrate structure further comprises an electrically insulating layer comprising a first electrically insulating material; and wherein the multilayer substrate structure further comprises an electrically insulating filler structure located laterally between the bridge die and the electrically insulating layer, wherein the electrically insulating filler structure comprises a second electrically insulating material different from the first electrically insulating material.

In example 2, the subject matter of example 1 can optionally include an average lateral dimension of the electrically insulating filler structure being larger than 5 µm.

In example 3, the subject matter of example 1 or 2 can optionally include an average lateral dimension of the electrically insulating filler structure being smaller than 15 µm.

In example 4, the subject matter of any of examples 1 to 3 can optionally include the electrically insulating filler structure extending from a level of the front surface of the bridge die towards a level of the back surface of the bridge die.

In example 5, the subject matter of any of examples 1 to 4 can optionally include at least part of the electrically insulating layer being located between a level of the front surface of the bridge die and a level of the back surface of the bridge die.

In example 6, the subject matter of any of examples 1 to 5 can optionally include the electrically insulating filler structure being a polyimide-based or epoxy-based filler structure.

In example 7, the subject matter of any of examples 1 to 6 can optionally include the electrically insulating layer being a build-up film layer.

In example 8, the subject matter of any of examples 1 to 7 can optionally further include a via portion formed on the first bridge die pad, wherein a maximal lateral dimension of the via portion is less than 10 µm.

In example 9, the subject matter of any of examples 1 to 8 can optionally include the electrically insulating filler structure comprising filler particles.

In example 10, the subject matter of any of examples 1 to 9 can optionally include a concentration of the filler particles in the electrically insulating filler structure lying between 10% and 50% of the weight of the electrically insulating filler structure.

In example 11, the subject matter of any of examples 1 to 10 can optionally include the multilayer substrate structure comprising filler particles.

In example 12, the subject matter of example 11 can optionally include a concentration of the filler particles in the multilayer substrate structure lying between 50% and 80% of the weight of the multilayer substrate structure.

Example 13 is an electrical device, comprising a die interconnect substrate according to any of examples 1 to 12; a first semiconductor device connected to the first bridge die pad; and a second semiconductor device connected to the second bridge die pad.

In example 14, the subject matter of example 13 can optionally include the die interconnect substrate, the first semiconductor device and the second semiconductor device being arranged in a common package.

Example 15 is a method for forming a die interconnect substrate, the method comprising: placing a bridge die in a cavity of a multilayer substrate structure, wherein the bridge die comprises at least one bridge interconnect connecting a first bridge die pad of the bridge die to a second bridge die pad of the bridge die, wherein the multilayer substrate structure comprises an electrically insulating layer forming a lateral surface of the multilayer substrate structure next to the cavity, wherein the electrically insulating layer comprises a first electrically insulating material, and wherein the multilayer substrate structure further comprises a substrate interconnect, wherein a portion of the substrate interconnect is located at a level below the bridge die; and forming an electrically insulating filler structure filling a gap located laterally between the bridge die and the multilayer substrate structure, wherein the electrically insulating filler structure comprises a second electrically insulating material different from the first electrically insulating material.

In example 16, forming the electrically insulating filler structure as described in the subject matter of example 15 can optionally include forming an electrically insulating filler layer at the lateral surface of the multilayer substrate structure, and removing at least part of the electrically insulating filler layer until the electrically insulating layer and the bridge die are exposed.

In example 17, removing at least part of the electrically insulating filler layer as described in the subject matter of example 16 can optionally include etching the electrically insulating filler layer, wherein an etch rate of the electrically insulating filler layer is at least 100 times an etch rate of the electrically insulating layer.

In example 18, forming the electrically insulating filler layer as described in the subject matter of example 16 or 17 can optionally include placing an electrically insulating laminate layer on the lateral surface of the multilayer structure and applying pressure to the electrically insulating laminate layer so that a portion of the electrically insulating laminate layer is pressed into the gap.

In example 19, the subject matter of any of examples 15 to 18 can optionally include the electrically insulating filler structure being a polyimide-based or epoxy-based filler structure.

In example 20, the subject matter of any of examples 15 to 19 can optionally include the electrically insulating layer being a build-up film layer.

In example 21, the subject matter of any of examples 15 to 20 can optionally further include forming a first via portion on the first bridge die pad and a second via portion on the second bridge die pad after forming the electrically insulating filler structure, wherein each via portion is part of a bridge contact structure to be formed on a bridge die pad of the bridge die.

In example 22, forming the first via portion and the second via portion as described in the subject matter of example 21 can optionally include forming a mask layer on the bridge die and removing portions of the mask layer to form openings exposing at least part of the first bridge die pad and at least part of the second bridge die pad by a lithographic process; and forming electrically conductive material in the openings of the mask layer to form the first via portion and the second via portion.

In example 23, the subject matter of example 21 or 22 can optionally include forming a second electrically insulating layer of the multilayer substrate structure on the lateral surface of the multilayer substrate structure; and planarizing a surface to expose the first via portion and the second via portion.

In example 24, the subject matter of example 23 can optionally include the second electrically insulating layer being the same material as the electrically insulating layer.

In example 25, the subject matter of any of examples 21 to 24 can optionally further include forming a first vertical wiring layer of the substrate interconnect, wherein forming the first vertical wiring layer comprises: forming an opening in at least the electrically insulating layer to expose at least part of the substrate interconnect by a laser process; and forming electrically conductive material in the opening of the electrically insulating layer to form the first vertical wiring layer.

In example 26, the subject matter of example 25 can optionally include the laser process for forming the first vertical wiring layer being the last laser process for forming openings for the formation of vertical wiring layers of the substrate interconnect.

In example 27, the subject matter of example 25 or 26 can optionally include the opening in at least the electrically insulating layer being formed before forming the first via portion on the first bridge die pad and the second via portion on the second bridge die pad.

In example 28, the subject matter example 27 can optionally further include simultaneously forming a first lateral wiring layer of the substrate interconnect, the first via portion and the second via portion in the same lithographic process.

In example 29, forming the first vertical wiring layer of the substrate interconnect as described in the subject matter of example 25 to 26 can optionally be carried out after forming the first via portion on the first bridge die pad and the second via portion on the second bridge die pad.

In example 30, the subject matter of any of examples 25, 26 or 29 can optionally further include simultaneously forming a first lateral wiring layer of the substrate interconnect and a first lateral wiring layer of a bridge contact structure to be formed on a bridge die pad of the bridge die, after forming the first via portion and the second via portion.

In example 31, the subject matter of any of examples 15 to 30 can optionally further include simultaneously forming a first contact interface structure and a second contact interface structure, wherein the first contact interface structure is connected to the first bridge die pad and wherein the second contact interface structure is connected to the substrate interconnect.

In example 32, forming the first contact interface structure and the second contact interface structure as described in the subject matter of example 31 can optionally include forming a solder resist mask layer at a lateral surface of the multilayer substrate structure and removing portions of the solder resist mask layer to form openings exposing the substrate interconnect and the bridge contact structure by a lithographic process; and forming electrically conductive material in the openings of the mask layer to form the first contact interface structure and the second contact interface structure.

In example 33, the subject matter of any of examples 15 to 32 can optionally further include attaching a semiconductor die to the first bridge die pad of the bridge die.

In example 34, the subject matter of example 33 can optionally further include attaching a second semiconductor die to the second bridge die pad of the bridge die.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A die interconnect substrate, comprising:
    a bridge die comprising at least one bridge interconnect connecting a first bridge die pad of the bridge die to a second bridge die pad of the bridge die; and
    a multilayer substrate structure comprising a substrate interconnect, wherein the bridge die is embedded in the multilayer substrate structure, and wherein the substrate interconnect extends from a level above the bridge die to a level below the bridge die,
    wherein the multilayer substrate structure further comprises an electrically insulating layer comprising a first electrically insulating material; and
    wherein the multilayer substrate structure further comprises an electrically insulating filler structure located laterally between the bridge die and the electrically insulating layer, wherein the electrically insulating filler structure comprises a second electrically insulating material different from the first electrically insulating material.

2. The die interconnect substrate according to claim 1, wherein an average lateral dimension of the electrically insulating filler structure is larger than 5 μm.

3. The die interconnect substrate according to claim 1, wherein an average lateral dimension of the electrically insulating filler structure is smaller than 15 μm.

4. The die interconnect substrate according to claim 1, wherein the electrically insulating filler structure extends from a level of the front surface of the bridge die towards a level of the back surface of the bridge die.

5. The die interconnect substrate according to claim 1, wherein at least part of the electrically insulating layer is located between a level of the front surface of the bridge die and a level of the back surface of the bridge die.

6. The die interconnect substrate according to claim 1, wherein the electrically insulating filler structure is a polyimide-based or epoxy-based filler structure.

7. The die interconnect substrate according to claim 1, wherein the electrically insulating layer is a build-up film layer.

8. The die interconnect substrate according to claim 1, further comprising a via portion formed on the first bridge die pad, wherein a maximal lateral dimension of the via portion is less than 10 μm.

9. The die interconnect substrate according to claim 1, wherein the electrically insulating filler structure comprises filler particles.

10. The die interconnect substrate according to claim 9, wherein a concentration of the filler particles in the electrically insulating filler structure lies between 10% and 50% of the weight of the electrically insulating filler structure.

11. The die interconnect substrate according to claim 1, wherein the multilayer substrate structure comprises filler particles.

12. The die interconnect substrate according to claim 11, wherein a concentration of the filler particles in the multilayer substrate structure lies between 50% and 80% of the weight of the multilayer substrate structure.

13. An electrical device, comprising
    a die interconnect substrate comprising a bridge die comprising at least one bridge interconnect connecting a first bridge die pad of the bridge die to a second bridge die pad of the bridge die;
    a first semiconductor device connected to the first bridge die pad; and
    a second semiconductor device connected to the second bridge die pad,
    wherein the die interconnect substrate further comprises a multilayer substrate structure comprising a substrate interconnect, wherein the bridge die is embedded in the multilayer substrate structure, and wherein the substrate interconnect extends from a level above the bridge die to a level below the bridge die,
    wherein the multilayer substrate structure further comprises an electrically insulating layer comprising a first electrically insulating material, and
    wherein the multilayer substrate structure further comprises an electrically insulating filler structure located laterally between the bridge die and the electrically insulating layer, wherein the electrically insulating filler structure comprises a second electrically insulating material different from the first electrically insulating material.

14. The electrical device according to claim 13, wherein the die interconnect substrate, the first semiconductor device and the second semiconductor device are arranged in a common package.

15. A method for forming a die interconnect substrate, the method comprising:
    placing a bridge die in a cavity of a multilayer substrate structure, wherein the bridge die comprises at least one bridge interconnect connecting a first bridge die pad of the bridge die to a second bridge die pad of the bridge die,
    wherein the multilayer substrate structure comprises an electrically insulating layer forming a lateral surface of the multilayer substrate structure next to the cavity, wherein the electrically insulating layer comprises a first electrically insulating material, and wherein the multilayer substrate structure further comprises a substrate interconnect, wherein a portion of the substrate interconnect is located at a level below the bridge die; and forming an electrically insulating filler structure filling a gap located laterally between the bridge die and the multilayer substrate structure, wherein the electrically insulating filler structure comprises a second electrically insulating material different from the first electrically insulating material.

16. The method according to claim 15, wherein forming the electrically insulating filler structure comprises forming an electrically insulating filler layer at the lateral surface of the multilayer substrate structure, and removing at least part of the electrically insulating filler layer until the electrically insulating layer and the bridge die are exposed.

17. The method according to claim 16, wherein removing at least part of the electrically insulating filler layer comprises etching the electrically insulating filler layer, wherein an etch rate of the electrically insulating filler layer is at least 100 times an etch rate of the electrically insulating layer.

18. The method according to claim 16, wherein forming the electrically insulating filler layer comprises placing an electrically insulating laminate layer on the lateral surface of the multilayer structure and applying pressure to the electrically insulating laminate layer so that a portion of the electrically insulating laminate layer is pressed into the gap.

19. The method according to claim 15, wherein the electrically insulating filler structure is a polyimide-based or epoxy-based filler structure.

20. The method according to claim 15, wherein the electrically insulating layer is a build-up film layer.

21. The method according to claim 15, further comprising forming a first via portion on the first bridge die pad and a second via portion on the second bridge die pad after forming the electrically insulating filler structure, wherein each via portion is part of a bridge contact structure to be formed on a bridge die pad of the bridge die.

22. The method according to claim 21, wherein forming the first via portion and the second via portion comprises:

forming a mask layer on the bridge die and removing portions of the mask layer to form openings exposing at least part of the first bridge die pad and at least part of the second bridge die pad by a lithographic process; and forming electrically conductive material in the openings of the mask layer to form the first via portion and the second via portion.

23. The method according to claim 21 or 22, further comprising forming a second electrically insulating layer of the multilayer substrate structure on the lateral surface of the multilayer substrate structure; and planarizing a surface to expose the first via portion and the second via portion.

24. The method according to claim 23, wherein the second electrically insulating layer is the same material as the electrically insulating layer.

25. The method according to claim 21, further comprising forming a first vertical wiring layer of the substrate interconnect, wherein forming the first vertical wiring layer comprises:

forming an opening in at least the electrically insulating layer to expose at least part of the substrate interconnect by a laser process; and forming electrically conductive material in the opening of the electrically insulating layer to form the first vertical wiring layer.

* * * * *